(12) United States Patent
Im et al.

(10) Patent No.: US 12,538,487 B2
(45) Date of Patent: Jan. 27, 2026

(54) SEMICONDUCTOR MEMORY DEVICE

(71) Applicant: SK hynix Inc., Icheon-si (KR)

(72) Inventors: Yeon Seob Im, Icheon-si (KR); Eun Mee Kwon, Icheon-si (KR); Nam Kuk Kim, Icheon-si (KR); Keon Soo Shim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 569 days.

(21) Appl. No.: 17/989,484

(22) Filed: Nov. 17, 2022

(65) Prior Publication Data

US 2023/0380162 A1 Nov. 23, 2023

(30) Foreign Application Priority Data

May 20, 2022 (KR) .................. 10-2022-0062321

(51) Int. Cl.
*H10B 43/27* (2023.01)
*H10B 43/10* (2023.01)
*H10B 43/40* (2023.01)

(52) U.S. Cl.
CPC .......... *H10B 43/27* (2023.02); *H10B 43/10* (2023.02); *H10B 43/40* (2023.02)

(58) Field of Classification Search
CPC ........ H10B 43/27; H10B 43/10; H10B 43/40; H10B 43/35; H10B 43/30; H10B 43/50
See application file for complete search history.

(56) References Cited

U.S. PATENT DOCUMENTS

| | | | |
|---|---|---|---|
| 10,032,666 B2* | 7/2018 | Shin | H10B 43/50 |
| 10,032,789 B2* | 7/2018 | Lee | H10B 43/27 |
| 10,475,804 B1 | 11/2019 | Nishikawa et al. | |
| 10,943,917 B2* | 3/2021 | Iwai | H01L 21/762 |
| 2018/0006055 A1* | 1/2018 | Kim | H10B 41/35 |
| 2018/0090509 A1* | 3/2018 | Zhang | H10B 43/50 |
| 2018/0151672 A1* | 5/2018 | Choi | H10B 41/27 |
| 2020/0251488 A1 | 8/2020 | Iwai et al. | |

FOREIGN PATENT DOCUMENTS

| | | |
|---|---|---|
| KR | 1020130045622 A | 5/2013 |
| KR | 101925012 B1 | 12/2018 |
| KR | 1020210012182 A | 2/2021 |
| KR | 1020210082275 A | 7/2021 |

* cited by examiner

*Primary Examiner* — Steven B Gauthier
*Assistant Examiner* — Khatib A Rahman
(74) *Attorney, Agent, or Firm* — WILLIAM PARK AND ASSOCIATES LTD.

(57) ABSTRACT

A semiconductor memory device includes a first channel structure which is adjacent to an insulating structure and penetrates a plurality of conductive layers, a second channel structure which is spaced apart from the insulating structure and penetrates the plurality of conductive layers, a first impurity region included in an end portion of the first channel structure, and a second impurity region included in an end portion of the second channel structure. A doping concentration of an impurity in the first impurity region is different from a doping concentration of an impurity in the second impurity region.

19 Claims, 21 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2022-0062321, filed on May 20, 2022, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

In order to improve the degree of integration of semiconductor memory devices, a three-dimensional semiconductor memory device has been proposed. The three-dimensional semiconductor device may include a plurality of memory cell strings. Each memory cell string may include a channel structure penetrating a plurality of stacked conductive layers. As an arrangement density of channel structures penetrating the plurality of conductive layers is increased, the degree of integration of the three-dimensional semiconductor memory device increases, but there is a limitation in ensuring the operational reliability of the semiconductor memory device.

SUMMARY

In accordance with an embodiment of the present disclosure, there may be provided a semiconductor memory device including: a word line; a select line spaced apart from the word line, the select line overlapping with the word line; an insulating structure overlapping with the word line, the insulating structure extending along an edge of the select line; a first channel structure adjacent to the insulating structure, the first channel structure penetrating the word line and the select line; a second channel structure spaced apart from the insulating structure, the second channel structure penetrating the word line and the select line; a first impurity region included in an end portion of the first channel structure, wherein the end portion of the first channel structure is adjacent to the select line; and a second impurity region included in an end portion of the second channel structure, wherein the end portion of the second channel structure is adjacent to the select line, wherein a doping concentration of an impurity in the first impurity region is different from a doping concentration of an impurity in the second impurity region.

In accordance with an embodiment of the present disclosure, there may be provided a semiconductor memory device including: a gate stack structure including a plurality of conductive layers and a plurality of interlayer insulating layers, wherein the conductive layers and the interlayer insulating layers each have a surface extending in first and second directions, the first and second directions intersecting each other, wherein the conductive layers and the interlayer insulation layers are alternately stacked in a third direction, and wherein the third direction intersects the surface; an insulating structure penetrating at least one of the plurality of conductive layers; a first channel structure in contact with the insulating structure, the first channel structure extending in the third direction to penetrate the gate stack structure; a second channel structure spaced apart from the insulating structure, the second channel structure extending in the third direction to penetrate the gate stack structure; a first impurity region included in an end portion of the first channel structure; and a second impurity region included in an end portion of the second channel structure, wherein each of the first impurity region and the second impurity region includes an n-type impurity, and wherein a doping concentration of the n-type impurity in the first impurity region is greater than a doping concentration of the n-type impurity in the second impurity region.

In accordance with an embodiment of the present disclosure, there may be provided a semiconductor memory device including: a gate stack structure including a plurality of conductive layers and a plurality of interlayer insulating layers, wherein the conductive layers and the interlayer insulating layers each have a surface extending in first and second directions, the first and second directions intersecting each other, wherein the conductive layers and the interlayer insulation layers are alternately stacked in a third direction, and wherein the third direction intersects the surface; an insulating structure penetrating at least one of the plurality of conductive layers; a first channel structure in contact with the insulating structure, the first channel structure extending in the third direction to penetrate the gate stack structure; a second channel structure spaced apart from the insulating structure, the second channel structure extending in the third direction to penetrate the gate stack structure; and a p-type impurity region included in a portion of the first channel structure adjacent to the insulating structure.

BRIEF DESCRIPTION OF THE DRAWINGS

Various examples of embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or additional intervening elements may also be present. Like reference numerals refer to like elements throughout the drawings.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present.

Various embodiments may provide a semiconductor memory device capable of improving operational reliability.

Figure 1:
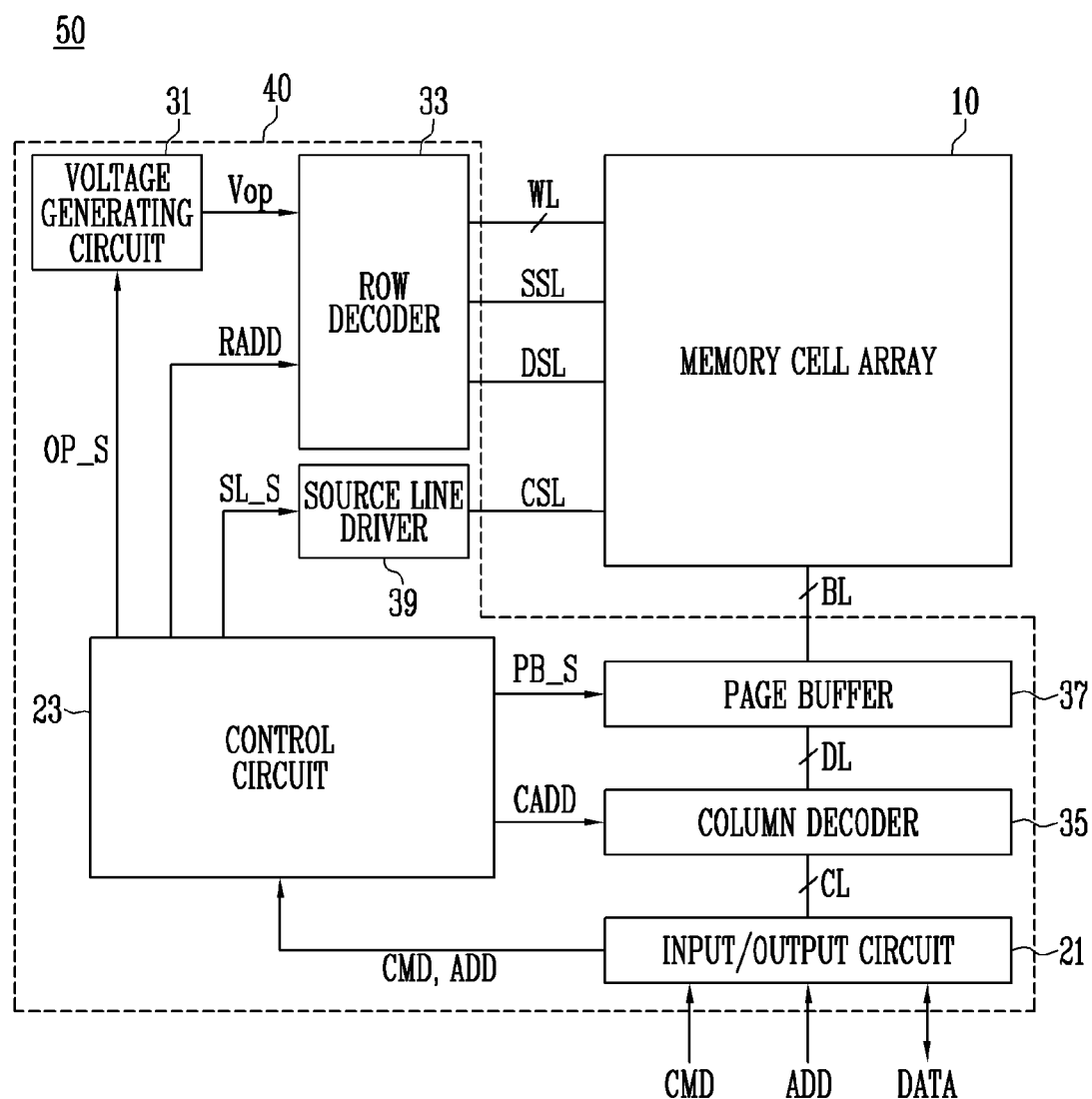
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 50 may include a peripheral circuit structure 40 and a memory cell array 10.

The peripheral circuit structure 40 may be configured to perform a program operation for storing data in the memory cell array 10, a read operation for outputting data stored in the memory cell array 10, and an erase operation for erasing data stored in the memory cell array 10. In an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may be connected to the peripheral circuit structure 40 through a common source line CSL, a bit line BL, a drain select line DSL, a word line WL, and a source select line SSL.

The input/output circuit 21 may transfer, to the control circuit 23, a command CMD and an address ADD, which received from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may transfer the operating voltages Vop to the drain select line DSL, the word line WL, and the source select line SSL in response to the row address RADD.

The column decoder 35 may transmit data DATA input from the input/output circuit 21 to the page buffer 37 or transmit data DATA stored in the page buffer 37 to the input/output circuit 21 in response to the column address CADD. The column decoder 35 may exchange data DATA with the input/output circuit 21 through a column line CL. The column decoder 35 may exchange data DATA with the page buffer through a data line DL.

The page buffer 37 may store data DATA received through the bit line BL in response to the page buffer control signal PB_S. The page buffer 37 may sense a voltage or current of the bit line BL in a read operation.

The source line driver 39 may control a voltage applied to the common source line CSL in response to the source line control signal SL_S.

Figure 2:
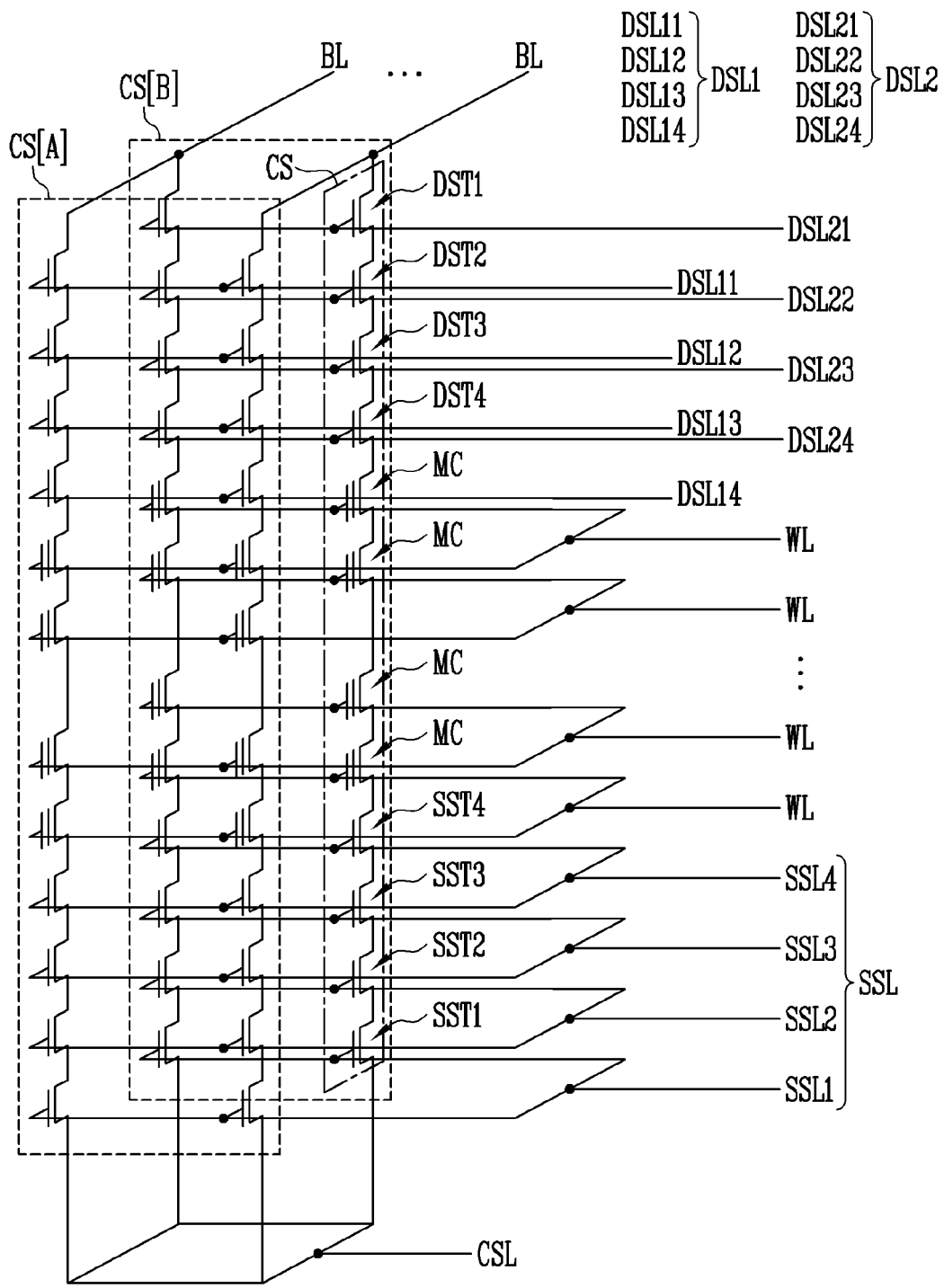
FIG. 2 is a circuit diagram illustrating a memory cell array in accordance with an embodiment of the present disclosure.

FIG. 2 is a circuit diagram illustrating a memory cell array in accordance with an embodiment of the present disclosure.

Referring to FIG. 2, the memory cell array may include a plurality of memory cell strings CS.

Each memory cell string CS may include at least one source select transistor SST1 to SST4, a plurality of memory cells MC, and at least one drain select transistor DST1 to DST4. The plurality of memory cells MC may be connected in series between the at least one source select transistor SST1 to SST4 and the at least one drain select transistor DST1 to DST4. The at least one source select transistor SST1 to SST4, the plurality of memory cells MC, and the at least one drain select transistor DST1 to DST4 may be connected in series by a channel semiconductor layer.

The plurality of memory cell strings CS may be connected in parallel to a common source line CSL. Each memory cell string CS may be connected to a corresponding bit line BL among a plurality of bit lines BL. The common source line CSL and the plurality of bit lines BL may be connected to channel semiconductor layers of the plurality of memory cell strings CS.

The plurality of memory cells MC of the memory cell string CS may be connected to the common source line CSL via the at least one source select transistor SST1 to SST4. The plurality of memory cells MC of the memory cell string CS may be connected to a bit line BL corresponding thereto via the at least one drain select transistor DST1 to DST4.

The memory cell string CS may be connected to a source select line SSL, a plurality of word lines WL1 to WLn, and a drain select line DSL1 or DSL2. The source select line SSL may include at least one sub-source select line. FIG. 2 illustrates first to fourth sub-source select lines SSL1 to SSL4. However, the embodiment of the present disclosure is not limited thereto, and the number of sub-source select lines may be variously designed. Each of the sub-source select lines SSL1 to SSL4 may be used as a gate electrode of a source select transistor corresponding thereto. The drain select line DSL1 or DSL2 may include at least one sub-drain select lines. FIG. 2 illustrates a first drain select line DSL1 including first to fourth sub-drain select lines DSL11 to DSL14 of a first group and a second drain select line DSL2 including first to fourth sub-drain select lines DSL21 to DSL24 of a second group. However, the embodiment of the present disclosure is not limited thereto, and the number of sub-drain select lines may be variously designed. Each of the sub-drain select lines DSL11 to DSL14 and DSL21 to DSL24 may be used as a gate electrode of a drain select transistor corresponding thereto.

The plurality of memory cell strings CS may be controlled by each of the plurality of word lines WL. The number of memory cell strings controlled by each bit line BL may be two or more. In an embodiment, one memory cell string of a first memory cell string group CS[A] and one memory cell string of a second memory cell string group CS[B] may be connected to each bit line BL. The first memory cell string group CS[A] and the second memory cell string group CS[B] may be individually controlled by drain select lines isolated from each other or source select lines isolated from each other. In an embodiment, the first memory cell string group CS[A] may be connected to a first drain select line DSL1, and the second memory cell string group CS[B] may be connected to a second drain select line DSL2. The first memory cell string group CS[A] and the second memory cell string group CS[B] may be connected to the same source select line SSL. Hereinafter, for convenience of description, structures of semiconductor memory devices in accordance with various embodiments of the present disclosure are described based on the example shown in FIG. 2, but the embodiments of the present disclosure are not limited thereto. In another embodiment, two or more memory cell string groups connected to the same bit line BL may be individually connected to two or more drain select lines isolated from each other, and be individually connected to two or more source select lines isolated from each other.

An operating voltage for precharging a channel semiconductor layer of a memory cell string CS may be applied to the bit line BL. The bit line BL may be connected to the channel semiconductor layer of the memory cell string CS through a contract plug.

An operating voltage for discharging a potential of the channel semiconductor layer of the memory cell string CS may be applied to the common source line CSL. The common source line CSL may be connected to the memory cell string CS through a doped semiconductor structure.

Figure 3A:
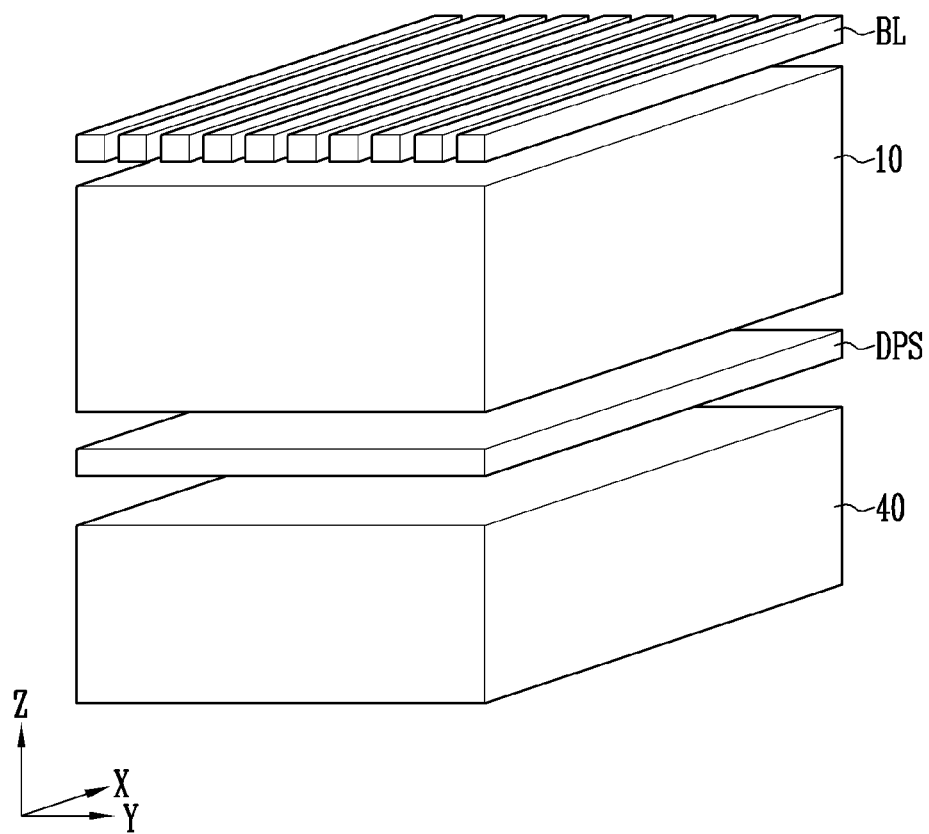
FIGS. 3A and 3B are views schematically illustrating vertical arrangements of a semiconductor memory device in accordance with embodiments of the present disclosure.
Figure 3B:
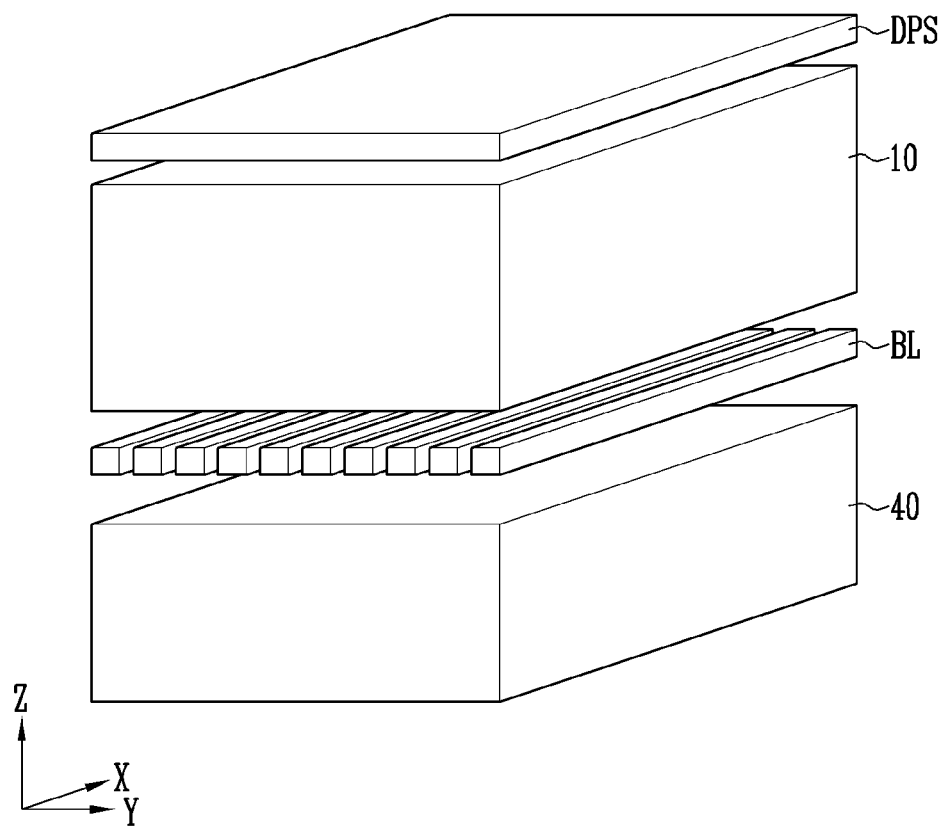

FIGS. 3A and 3B are views schematically illustrating vertical arrangements of a semiconductor memory device in accordance with embodiments of the present disclosure.

Referring to FIGS. 3A and 3B, the semiconductor memory device may include a doped semiconductor structure DSP, a memory cell array 10, and a plurality of bit lines BL. The doped semiconductor structure DSP may extend along an XY plane. The doped semiconductor structure DSP may be connected to the common source line CSL shown in FIG. 2. The memory cell array 10 may be disposed between the plurality of bit lines BL and the doped semiconductor structure DPS.

Referring to FIG. 3A, a peripheral circuit structure 40 of the semiconductor memory device may be adjacent to the doped semiconductor structure DPS. Accordingly, the peripheral circuit structure 40, the doped semiconductor structure DPS, the memory cell array, and the bit line BL may be sequentially arranged in a Z-axis direction as a vertical direction. Although not shown in the drawing, a plurality of interconnections may be disposed between the peripheral circuit structure 40 and the doped semiconductor structure DPS, or a plurality of interconnections and a plurality of conductive bonding pads may be disposed between the peripheral circuit structure 40 and the doped semiconductor structure DPS.

Referring to FIG. 3B, the peripheral circuit structure 40 of the semiconductor memory device may be adjacent to the plurality of bit lines BL. Accordingly, the peripheral circuit structure 40, the bit line BL, the memory cell array 10, and the doped semiconductor structure DSP may be sequentially arranged in the Z-axis direction as the vertical direction. Although not shown in the drawing, a plurality of interconnections may be disposed between the peripheral circuit structure 40 and the plurality of bit lines BL, or a plurality of interconnections and a plurality of conductive bonding pads may be disposed between the peripheral circuit structure 40 and the plurality of bit lines BL.

Referring to FIGS. 3A and 3B, the doped semiconductor structure DPS, the memory cell array 10, and the plurality of bit lines BL may overlap with the peripheral circuit structure 40. The memory cell array 10 may include a plurality of conductive layers stacked to be spaced apart from each other in the Z-axis direction, a plurality of channel structures penetrating the plurality of conductive layers, and a memory layer surrounding each channel structure. The plurality of conductive layers may extend on an XY plane intersecting the plurality of channel structures. The plurality of bit lines BL may extend in parallel to each other, and be spaced apart from each other.

A manufacturing process of the semiconductor memory device may vary. In an embodiment, the process for forming the memory cell array 10 may be performed on the peripheral circuit structure 40. In another embodiment, a first structure including the memory cell array 10 may be formed separately from a second structure including the peripheral circuit structure 40. The first structure and the second structure may be connected to each other through a plurality of conductive bonding pads.

Figure 4:
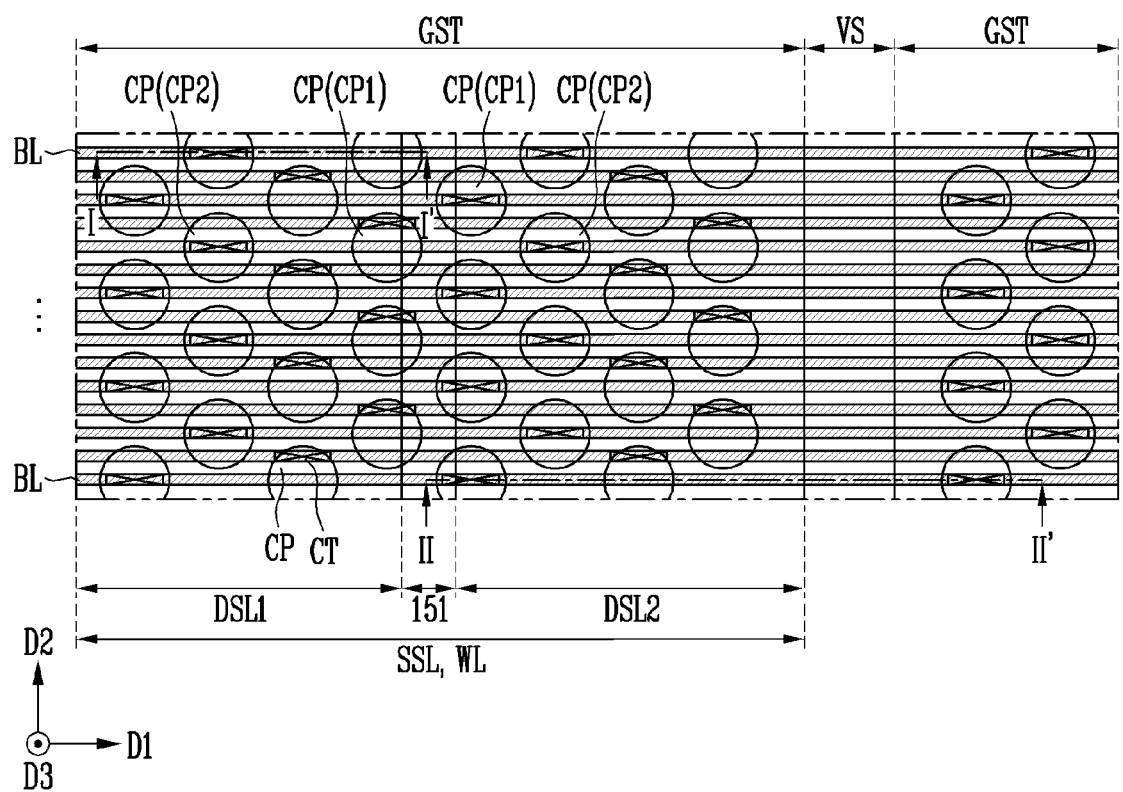
FIG. 4 is a plan view illustrating a semiconductor memory device in accordance with an embodiment of the present disclosure.

FIG. 4 is a plan view illustrating a semiconductor memory device in accordance with an embodiment of the present disclosure.

Referring to FIG. 4, a memory cell array of the semiconductor memory device may include a plurality of gate stack structures GST and a plurality of cell plugs CP penetrating each gate stack structure GST. A plurality of bit lines BL of the semiconductor memory device may overlap with the plurality of cell plugs CP. The plurality of cell plugs CP may be connected to the plurality of bit lines BL via a plurality of contact plugs CT.

Each gate stack structure GST may include a plurality of layers extending in a first direction D1 and a second direction D2, in which axes intersecting each other face. The plurality of layers of the gate stack structure GST may be stacked in a third direction D3. The gate stack structure GST may be partitioned by a vertical structure VS. The vertical structure VS may be disposed between gate stack structures GST adjacent to each other.

The plurality of layers of the gate stack structure GST may include a source select line SSL, a plurality of word lines WL, and two or more drain select lines DSL1 and DSL2. The two or more drain select lines DSL1 and DSL2 may be arranged to be spaced apart from each other in the first direction D1. The plurality of word lines WL may be disposed to be spaced apart from the source select line SSL in the third direction D3. The plurality of word lines WL may be disposed to be spaced apart from each other in the third direction D3. The two or more drain select lines DSL1 and DSL2 may be disposed to be spaced apart from the plurality of word lines WL in the third direction D3. The two or more drain select lines DSL1 and DSL2 may be spaced apart from each other with an insulating structure 151 interposed therebetween. In an embodiment, the two or more drain select lines DSL1 and DSL2 may include a first drain select line DSL1 and a second drain select line DSL2, which are adjacent to each other in the first direction D1.

Each of the plurality of word lines WL may overlap with the first drain select line DSL1 and the second drain select line DSL2. To this end, the plurality of word lines WL may be formed to have a width wider than a width of each of the first drain select line DSL1 and the second drain select line DSL2 in the first direction D1. Each of the plurality of word lines WL may continuously extend in the first direction D1 to overlap with the first drain select line DSL1, the insulating structure 151, and the second drain select line DSL2.

The insulating structure 151 may extend along edges of the first drain select line DSL1 and the second drain select line DSL2.

The source select line SSL may extend in parallel to the plurality of word lines WL. In an embodiment, the source select line SSL may continuously extend in the first direction D1 to overlap with the first drain select line DSL1, the insulating structure 151, and the second drain select line DSL2.

The plurality of bit lines BL may extend in a direction intersecting the first drain select line DSL1 and the second drain select line DSL2. In an embodiment, the plurality of bit lines BL may extend in the first direction D1.

The plurality of cell plugs CP may extend in the third direction D3. The plurality of cell plugs CP may penetrate each of the source select line SSL and the plurality of word lines WL. Each of the first drain select line DSL1 and the second drain select line DSL2 may be penetrated by a cell plug CP corresponding thereto. The insulating structure 151 may overlap with some of the plurality of cell plugs CP.

The plurality of cell plugs CP may be arranged on a plurality of columns spaced from each other along a direction in which the plurality of bit lines BL extend and a plurality of rows spaced apart from each other along a direction intersecting the plurality of bit lines BL. The plurality of cell plugs CP may include a first cell plug CP1 adjacent to the insulating structure 151 and a second cell plug CP2 spaced apart from the insulating structure 151. In order to maximize the degree of integration of memory cells, an arrangement pitch of the plurality of cell plugs CP may be a critical dimension within the gate stack structure GST. In this case, the first cell plug CP1 may include a part overlapping with the insulating structure 151.

The plurality of contact plugs CT may be respectively connected to the plurality of cell plugs CP. The plurality of cell plugs CP may be electrically connected to the plurality of bit lines BL via the plurality of contact plugs CT. The arrangement pitch of the plurality of contact plugs CT may be designed according to the arrangement pitch of the plurality of bit lines BL, and the arrangement pitch of the plurality of bit lines BL may vary according to design rules of the semiconductor memory device.

Figure 5:
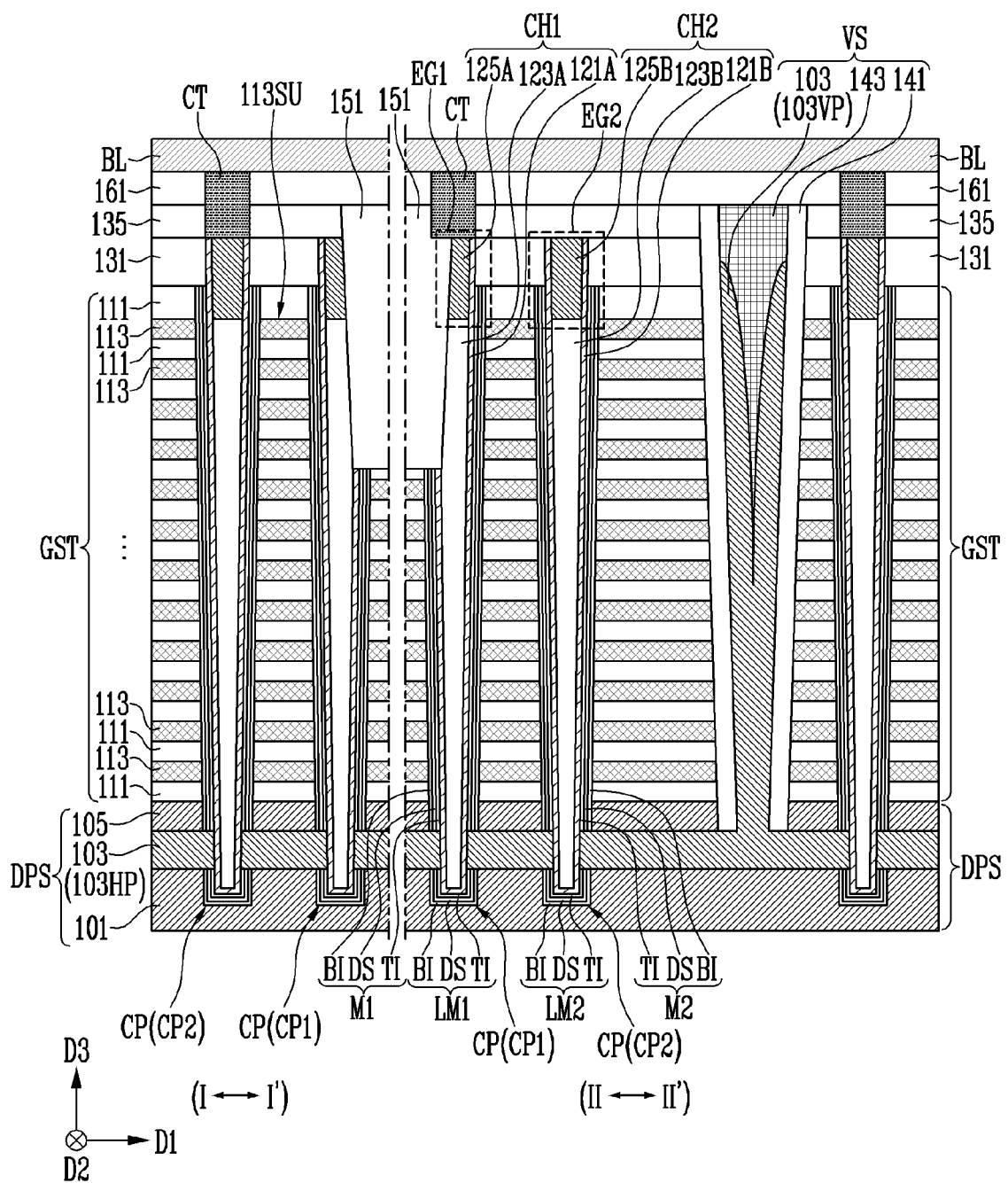
FIG. 5 illustrate a section of the semiconductor memory device taken along lines I-I' and II-II' shown in FIG. 4.

FIG. 5 illustrate a section of the semiconductor memory device taken along lines I-I' and II-II' shown in FIG. 4.

Referring to FIG. 5, the gate stack structure GST of the semiconductor memory device may include a plurality of conductive layers 113. The plurality of conductive layers 113 may have a surface 113SU extending in the first direction D1 and the second direction D2. The plurality of conductive layers 113 may be stacked to be spaced apart from each other in the third direction D3 intersecting the surface 113SU. Conductive layers 113 adjacent to each other in the third direction D3 may be insulated from each other.

To this end, the gate stack structure GST may include a plurality of interlayer insulating layers 111 alternately stacked in the third direction D3 with the plurality of conductive layers 113. Each conductive layer 113 may include at least one of a doped semiconductor layer, a metal layer, and a conductive metal nitride layer. The doped semiconductor layer may include a doped silicon layer. The metal layer may include tungsten, copper, molybdenum, and the like. The conductive metal nitride layer may include titanium nitride, tantalum nitride, and the like.

The gate stack structure GST may be disposed between the plurality of bit lines BL and a doped semiconductor structure DPS. At least one conductive layer adjacent to the doped semiconductor structure DPS among the plurality of conductive layers 113 may be used as the source select line SSL shown in FIGS. 2 and 4. At least one conductive layer which is adjacent to the plurality of bit lines BL and is isolated by the insulating structure 151 among the plurality of conductive layers 113 may be used as the first drain select line DSL1 and the second drain select line DSL2, which are shown in FIGS. 2 and 4. Conductive layers as intermediate layers, which are disposed between the conductive layer for the source select line and the conductive layer for the first or second drain select line among the plurality of conductive layers 113 may be used as the plurality of word lines WL shown in FIGS. 2 and 4.

The insulating structure 151 may penetrate at least one conductive layer 113 adjacent to the bit line BL. The conductive layer penetrated by the insulating structure 151 may be isolated into drain select lines. The insulating structure 151 may be disposed inside the gate stack structure GST, and be formed to a depth to which the insulating structure 151 does not penetrate the conductive layers for the word lines among the plurality of conductive layers 113.

At least one insulating layer may be disposed between the gate stack structure GST and the plurality of bit lines BL. In an embodiment, a first insulating layer 131, a second insulating layer 135, and a third insulating layer 161 may be interposed between the gate stack structure GST and the plurality of bit lines BL. The first insulating layer 131, the second insulating layer 135, and the third insulating layer 161 may be stacked in the third direction D3. The insulating structure 151 may extend in the third direction D3 to penetrate the first insulating layer 131 and the second insulating layer 135.

The plurality of bit lines BL and the plurality of contact plugs CT may be formed of a conductive material. The plurality of bit lines BL may be electrically connected to the plurality of cell plugs CP through the plurality of contact plugs CT. The plurality of contact plugs CT may penetrate at least one insulating layer between the plurality of cell plugs CP and the plurality of bit lines BL. In an embodiment, the plurality of contact plugs CT may penetrate the second insulating layer 135 and the third insulating layer 161.

The doped semiconductor structure DPS may include a lower doped semiconductor layer 101, the channel contact layer 103, and an etch stop layer 105. A horizontal part 103HP of the channel contact layer 103 may be disposed between the lower doped semiconductor layer 101 and the gate stack structure GST. The etch stop layer 105 may be disposed between the horizontal part 103HP of the channel contact layer 103 and the gate stack structure GST. The etch stop layer 105 may be omitted in some cases.

The channel contact layer 103 may be formed as a doped semiconductor layer. Each of the lower doped semiconductor layer 101 and the channel contact layer 103 may include at least one of an n-type impurity and a p-type impurity.

The etch stop layer 105 may be formed of a material selected by considering an etching process for providing a space in which the vertical structure VS is to be disposed and an etch selectivity. In an embodiment, the etch stop layer 105 may include a silicon layer.

The vertical structure VS may extend along a sidewall of the gate stack structure GST. The vertical structure VS may penetrate the first insulating layer 131 and the second insulating layer 135. The vertical structure VS may extend to penetrate the etch stop layer 105. In an embodiment, the vertical structure VS may include a vertical part 103VP of the channel contact layer 103, a metal layer 143, and a sidewall insulating layer 141. The sidewall insulating layer 141 may extend along the sidewall of the gate stack structure GST, and penetrate the etch stop layer 105. The sidewall insulating layer 141 may insulate the metal layer 143 and the vertical part 103VP of the channel contact layer 103 from the plurality of conductive layers 113 of the gate stack structure GST. The vertical part 103 VP of the channel contact layer 103 may extend in the third direction D3 along the sidewall insulating layer 141 from the horizontal part 103HP of the channel contact layer 103. The metal layer 143 may be disposed on the vertical part 103VP of the channel contact layer 103. The metal layer 143 may be in contact with the channel contact layer 103, to be electrically connected to the doped semiconductor structure DSP. Although not shown in the drawing, at least one of a metal silicide layer and a conductive metal nitride layer may be further disposed between the metal layer 143 and the channel contact layer 103. The vertical part 103VP of the channel contact layer 103 and the metal layer 143 may be insulated from the bit line BL by the third insulating layer 161. The configuration of the vertical structure VS is not limited to the embodiment shown in the drawing. In another embodiment, the vertical structure VS may be formed of an insulating material filling a space between gate stack structures GST adjacent to each other.

The plurality of cell plugs CP may penetrate not only the gate stack structure GST but also the etch stop layer 105, and extend to the inside of the lower doped semiconductor layer 101. A portion of the cell plug CP between the etch stop layer 105 and the lower doped semiconductor layer 101 may be surrounded by the horizontal part 103HP of the channel contact layer 103. The plurality of cell plugs CP may further protrude in the third direction D3 than the gate stack structure GST. Portions of the plurality of cell plugs CP, which further protrude than the gate stack structure GST, may be surrounded by the first insulating layer 131.

A first cell plug CP1 among the plurality of cell plugs CP may include a first channel structure CH1 and a first memory layer M1. The first cell plug CP1 may further include a first lower memory layer LM1 spaced apart from the first memory layer M1. A second cell plug CP2 among the plurality of cell plugs CP may include a second channel structure CH2 and a second memory layer M2. The second cell plug CP2 may further include a second lower memory layer LM2 spaced apart from the second memory layer M2.

The first channel structure CH1 and the second channel structure CH2 may penetrate not only the gate stack structure GST but also the etch stop layer 105, and extend to the inside of the lower doped semiconductor layer 101.

The first channel structure CH1 may be in contact with the insulating structure 151. The first channel structure CH1 may include a first core insulating layer 123A extending in the third direction D3, a first capping semiconductor layer 125A on the first core insulating layer 123A, and a first channel semiconductor layer 121A extending along a sidewall of the first core insulating layer 123A and a sidewall of the first capping semiconductor layer 125A. The first channel semiconductor layer 121A may extend along a bottom surface of the first core insulating layer 123A. The first channel semiconductor layer 121A and the first capping semiconductor layer 125A may extend to penetrate the first insulating layer 131. The position of a boundary portion of the first capping semiconductor layer 125A and the first core insulating layer 123A may be variously designed. In an embodiment, the boundary portion of the first capping semiconductor layer 125A and the first core insulating layer 123A may be located at a level at which an uppermost conductive layer among the plurality of conductive layers 113 is disposed. The uppermost conductive layer may be used as a first drain select line or a second drain select line.

The first memory layer M1 may be disposed between the first channel structure CH1 and the gate stack structure GST. The first lower memory layer LM1 may be disposed between the first channel structure CH1 and the lower doped semiconductor layer 101. The horizontal part 103HP of the channel contact layer 103 may be in contact with a sidewall of the first channel semiconductor layer 121A between the first memory layer M1 and the first lower memory layer LM1.

The first channel structure CH1 and the first memory layer M1 may include a part overlapping with a bottom surface of the insulating structure 151. The insulating structure 151 may be formed to penetrate a portion of the first channel structure CH1 and a portion of the first memory layer M1. The portion of the first channel structure CH1, which overlaps with the bottom surface of the insulating structure 151, may be formed shorter in the third direction D3 than the other portion of the first channel structure CH1. The other portion of the first channel structure CH1 may include a part penetrating the gate stack structure GST and a part extending along a sidewall of the insulating structure 151. Similarly, the portion of the first memory layer M1, which overlaps with the bottom surface of the insulating structure 151, may be formed shorter in the third direction D3 than the other portion of the first memory layer M1. The other portion of the first memory layer M1 may include a part penetrating the gate stack structure GST and a part extending along the sidewall of the insulating structure 151. As described above, each of the first channel structure CH1 and the first memory layer M1 may be formed in an asymmetric structure.

The second channel structure CH2 may be spaced apart from the insulating structure 151. The second channel structure CH2 may include a second core insulating layer 123B extending in the third direction D3, a second capping semiconductor layer 125B on the second core insulating layer 123B, and a second channel semiconductor layer 121B extending along a sidewall of the second core insulating layer 123B and a sidewall of the second capping semiconductor layer 125B. The sidewall of the second capping semiconductor layer 125B may be surrounded by the second channel semiconductor layer 121B. The second channel semiconductor layer 121B may extend along a bottom surface of the second core insulating layer 123B. The second channel semiconductor layer 121B and the second capping semiconductor layer 125B may extend to penetrate the first insulating layer 131. A boundary portion of the second capping semiconductor layer 125B and the second core insulating layer 123B may be located at the substantially same level as the boundary portion of the first capping semiconductor layer 125A and the first core insulating layer 123A.

The second memory layer M2 may be disposed between the second channel structure CH2 and the gate stack structure GST. The second lower memory layer LM2 may be disposed between the second channel structure CH2 and the lower doped semiconductor layer 101. The horizontal part 103HP of the channel contact layer 103 may be in contact with a sidewall of the second channel semiconductor layer 121B between the second memory layer M2 and the second lower memory layer LM2.

Each of the first capping semiconductor layer 125A and the second capping semiconductor layer 125B may be formed as a doped semiconductor layer including a first conductivity type impurity as a majority carrier. In an embodiment, each of the first capping semiconductor layer 125A and the second capping semiconductor layer 125B may be formed as an n-type doped semiconductor layer including an n-type impurity. Specifically, each of the first capping semiconductor layer 125A and the second capping semiconductor layer 125B may include n-type doped silicon.

Each of the first channel semiconductor layer 121A and the second channel semiconductor layer 121B may be used as a channel region of a memory cell string corresponding thereto. Each the first channel semiconductor layer 121A and the second channel semiconductor layer 121B may be formed of a semiconductor material including silicon, germanium, and the like.

An impurity region including at least one of a first conductivity type impurity and a second conductivity type impurity may be included in an end portion of the first channel semiconductor layer 121A adjacent to the first capping semiconductor layer 125A and an end portion of the second channel semiconductor layer 121B adjacent to the second capping semiconductor layer 125B.

The above-described end portions of the first capping semiconductor layer 125A and the first channel semiconductor layer 121A may form an end portion EG1 of the first channel structure CH1, and the above-described end portions of the second capping semiconductor layer 125B and the second channel semiconductor layer 121B may form an end portion EG2 of the second channel structure CH2. The end portion EG1 of the first channel structure CH1 and the end portion EG2 of the second channel structure CH2 may face the bit line BL, and be adjacent to the conductive layer for the drain select line among the plurality of conductive layers 113. A first impurity region may be included in the end portion EG1 of the first channel structure CH1, and a second impurity region may be included in the end portion EG2 of the second channel structure CH2. An impurity doping concentration in the first impurity region and an impurity doping concentration in the second impurity region may be controlled differently from each other. The first impurity region and the second impurity region will be described with reference to FIGS. 7A to 7C and 8.

Each of the first memory layer M1, the second memory layer M2, the first lower memory layer LM1, and the second lower memory layer LM2 may include a tunnel insulating layer TI, a data storage layer DS, and a blocking insulating layer BI. The tunnel insulating layer TI may extend along an outer wall of a channel semiconductor layer 121A or 121B corresponding thereto. The data storage layer DS may extend along an outer wall of the tunnel insulating layer TI. The blocking insulating layer BI may extend along an outer wall of the data storage layer DS. The data storage layer DS may be formed of a material layer capable of storing data changed using Fowler-Nordheim tunneling. To this end, the data storage layer DS may be formed of various materials. For example, the data storage layer DS may be formed as a charge trap layer. The charge trap layer may include a silicon nitride layer. However, the present disclosure is not limited thereto, and the data storage layer DS may include a phase change material, a nano dot, and the like. The blocking insulating layer BI may include an insulating material capable of blocking charges. The tunnel insulating layer TI may be formed as a silicon oxide layer through which charges can tunnel.

The doped semiconductor structure DPS is not limited as described above, and may be in contact with the first channel semiconductor layer 121A and the second channel semiconductor layer 121B without interposition of the first lower memory layer LM1 and the second lower memory layer LM2. Hereinafter, another embodiment of the doped semiconductor structure DPS will be described with reference to FIG. 6.

Figure 6:
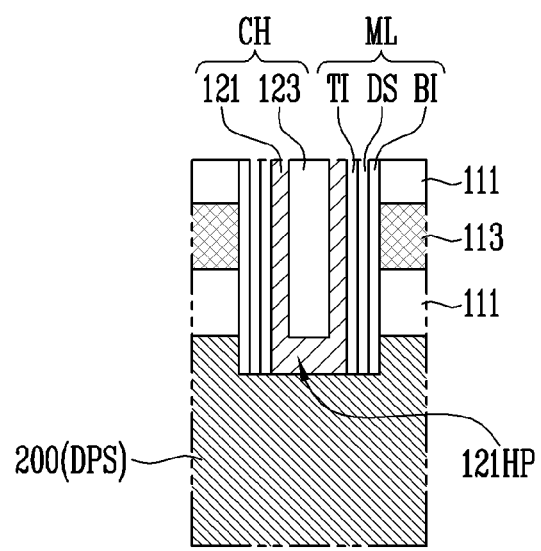
FIG. 6 is a sectional view illustrating a doped semiconductor structure and a channel structure in accordance with an embodiment of the present disclosure.

FIG. 6 is a sectional view illustrating a doped semiconductor structure and a channel structure in accordance with an embodiment of the present disclosure.

Referring to FIG. 6, a doped semiconductor structure DPS may be formed as a doped semiconductor layer 200 including at least one of an n-type impurity and a p-type impurity. A channel structure CH may penetrate the interlayer insulating layer 111 and the conductive layer 113 as described with reference to FIG. 5. A channel semiconductor layer 121 of the channel structure CH may extend along a sidewall and a bottom surface of a core insulating layer 123. A horizontal part 121HP of the channel semiconductor layer 121, which extends along the bottom surface of the core insulating layer 123, may be in contact with the doped semiconductor layer 200.

A memory layer ML may extend along a sidewall of the channel structure CH. The memory layer ML may include a tunnel insulating layer TI, a data storage layer DS, and a blocking insulating layer BI.

The structures described with reference to FIGS. 4, 5, and 6 may be applied to the semiconductor memory device shown in FIG. 3A or may be applied in a vertically reversed form to the semiconductor memory device shown in FIG. 3B.

Figure 7A:
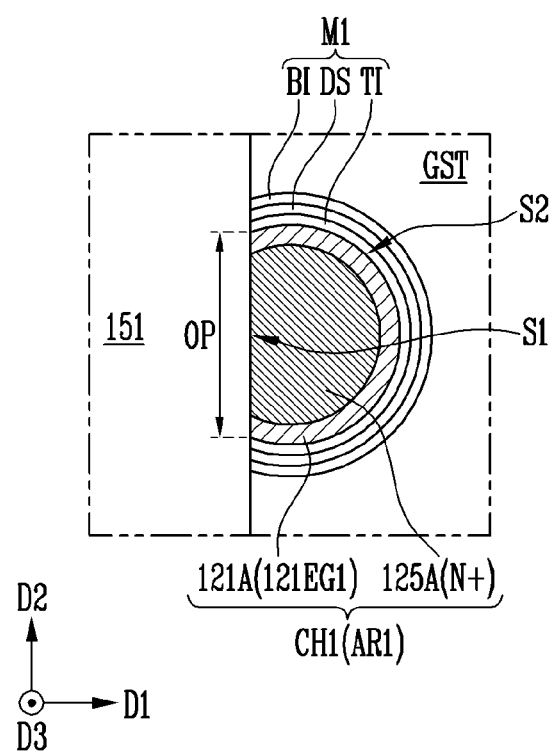
FIGS. 7A, 7B, and 7C are plan views illustrating a first channel structure in accordance with embodiments of the present disclosure.
Figure 7B:
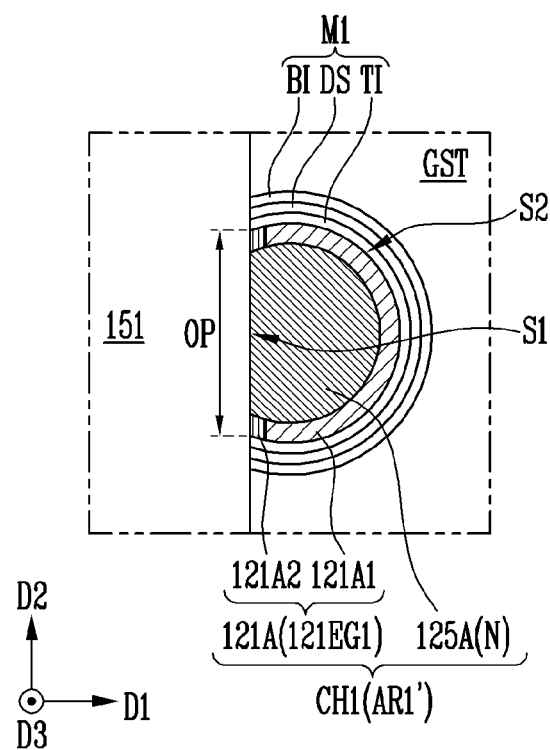
Figure 7C:
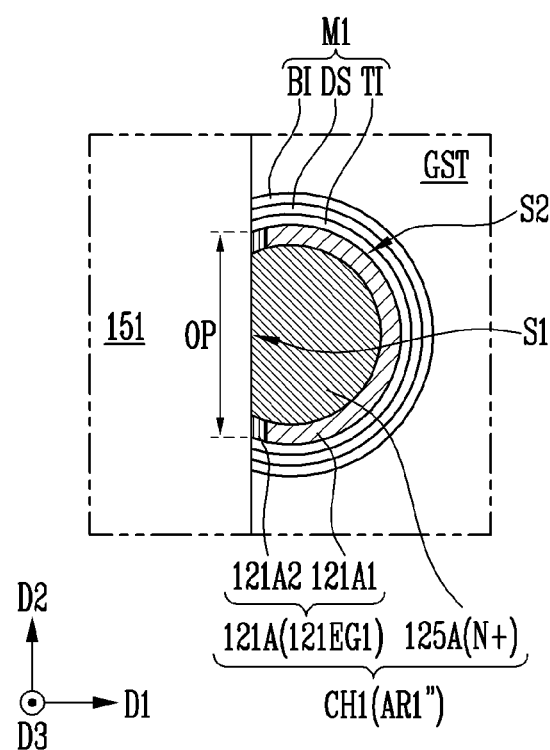
Figure 8:
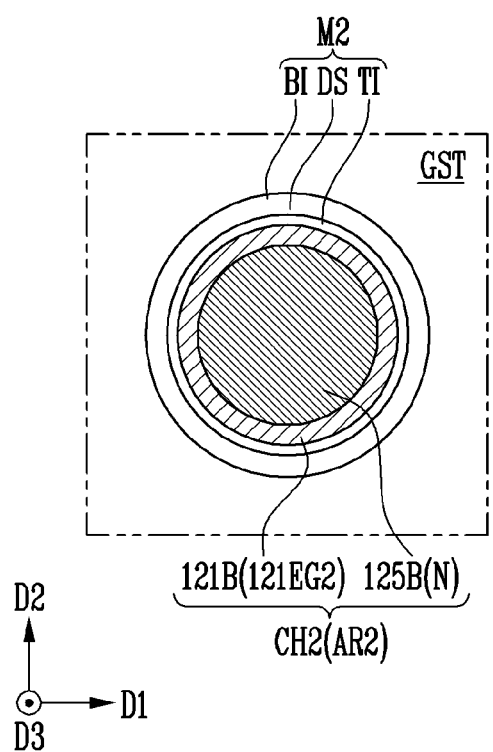
FIG. 8 is a plan view illustrating a second channel structure in accordance with an embodiment of the present disclosure.

FIGS. 7A to 7C are plan views illustrating a first channel structure in accordance with embodiments of the present disclosure. FIGS. 7A to 7C illustrate a cross-sectional structure of an end portion of the first channel structure. FIG. 8 is a plan view illustrating a second channel structure in accordance with an embodiment of the present disclosure. FIG. 8 illustrates a cross-sectional structure of an end portion of the second channel structure. Hereinafter, overlapping descriptions of components identical to those described with reference to FIGS. 4 and 5 will be omitted.

Referring to FIGS. 7A to 7C, the first channel structure CH1 may be formed in an asymmetric structure. In an embodiment, the first channel structure CH1 may include a linear first side portion S1 in contact with the insulating structure 151 and a round second side portion S2. The second side portion S2 may extend from the first side portion S1 in a direction distant from the insulating structure 151. The second side portion S2 may be surrounded by the gate stack structure GST.

An end portion 121EG1 of the first channel semiconductor layer 121A and the first capping semiconductor layer 125A may be in contact with the insulating structure 151. The first memory layer M1 may include an opening OP opened toward the insulating structure 151. Each of the blocking insulating layer BI, the data storage layer DS, and the tunnel insulating layer TI of the first memory layer M1 may extend along the second side portion S2.

A first impurity region AR1, AR1' or AR1" may be included in the end portion 121EG1 of the first channel semiconductor layer 121A and the first capping semiconductor layer 125A.

Referring to FIG. 8, the second channel structure CH2 may be formed in a gate all around (GAA) structure in which the second channel structure CH2 is surrounded by the gate stack structure GST. A cross-sectional structure of the second channel structure CH2 may be different from the cross-sectional structure of the first channel structure CH1 shown in FIGS. 7A to 7C. In an embodiment, the second channel structure CH2 may have a circular cross-sectional structure.

An end portion 121EG2 of the second channel semiconductor layer 121B may have a cross-sectional structure different from a cross-sectional structure of the end portion 121EG1 of the first channel semiconductor layer 121A, which is shown in FIGS. 7A to 7C. The second capping semiconductor layer 125B may have a cross-sectional structure different from a cross-sectional structure of the first capping semiconductor layer 125A shown in FIGS. 7A to 7C. In an embodiment, the end portion 121EG2 of the second channel semiconductor layer 121B may have an annular cross-sectional structure, and the second capping semiconductor layer 125B may have a circular cross-sectional structure.

Each of the blocking insulating layer BI, the data storage layer DS, and the tunnel insulating layer TI of the second memory layer M2 may surround a sidewall of the second channel structure CH2. In an embodiment, the second memory layer M2 may be formed in an annular shape surrounding the sidewall of the second channel structure CH2.

A second impurity region AR2 may be included in the end portion 121EG2 of the second channel semiconductor layer 121B and the second capping semiconductor layer 125B. The second impurity region AR2 may include a first conductivity type impurity. The first conductivity type impurity may include an n-type impurity including phosphorus and the like.

Referring to FIGS. 7A to 7C and 8, the first side portion S1 of the first channel structure CH1 may be in contact with the insulating structure 151, and the second channel structure CH2 may be formed in the GAA structure. Therefore, in an operation of the semiconductor memory device, a difference may occur in an electrical characteristic between the first channel structure CH1 and the second channel structure CH2 under a condition of the same voltage. In order to reduce the difference, an impurity doping concentration inside the first channel structure CH1 may be differentiated from an impurity doping concentration inside the second channel structure CH2.

Referring to FIG. 7A, a first impurity region AR1 may include a first conductivity type impurity, like the second impurity region AR2 shown in FIG. 8. A doping concentration of the first conductivity type impurity in the first impurity region AR1 may be different from a doping concentration of the second impurity region AR2 shown in FIG. 8. An erase operation of the semiconductor memory device may be performed by a gate induced drain leakage (GIDL) current generated at the end portion EG1 of the first channel structure CH1 shown in FIG. 5 and the end portion EG2 of the second channel structure CH2 shown in FIG. 5.

GIDL current generation efficiency may be in proportion to the area of a channel structure. The area of the first channel structure CH1 at the end portion of the first channel structure CH1 may be lost by the insulating structure 151. Accordingly, under the same doping condition, GIDL current generation efficiency in the first channel structure may be lower than GIDL current generation efficiency in the second channel structure CH2. In an embodiment of the present disclosure, a doping concentration of an n-type impurity in the first impurity region AR1 is controlled to be greater than a doping concentration of the n-type impurity in the second impurity region AR2, so that the GIDL current generation efficiency of the first channel structure CH1 may be improved.

Referring to FIGS. 7B and 7C, the end portion 121EG1 of the first channel semiconductor layer 121A may include a first conductivity type impurity region 121A1 and a second conductivity type impurity region 121A2. The second conductivity type impurity may be a p-type impurity such as boron, which is contrary to the first conductivity type impurity. The second conductivity type impurity region 121A2 may be disposed between the first conductivity type impurity region 121A1 and the insulating structure 151. In an embodiment, the first conductivity type impurity region 121A1 may include a n-type impurity.

In an embodiment, a leakage current is easily generated at a portion of the end portion 121EG1 of the first channel semiconductor layer 121A, which in contact with the insulating structure 151, even when an off-voltage is applied to the conductive layer of the gate stack structure GST. In an embodiment of the present disclosure, the second conductivity type impurity region 121A2 is defined by doping the portion in contact with the insulating structure 151 with a p-type impurity, so that the leakage current may be reduced. Accordingly, in an embodiment, during an operation of the semiconductor memory device, a leakage current characteristic difference between the first channel structure CH1 and the second channel structure CH2 may be reduced under the same voltage condition.

Referring to FIG. 7B, in an embodiment, a doping concentration of the first conductivity type impurity in the first capping semiconductor layer 125A may be controlled to be substantially the same as a doping concentration of the first conductivity type impurity in the second capping semiconductor layer 125B shown in FIG. 8.

As described above, a first impurity region AR1' may include a second conductivity type impurity having a doping concentration locally greater than a doping concentration of the second impurity region AR2 shown in FIG. 8.

Referring to FIG. 7C, in an embodiment, in order to not only reduce the leakage current but also improve the current generation efficiency, a doping concentration of the first conductivity type impurity in the first capping semiconductor layer 125A may be controlled to be greater than a doping concentration of the first conductivity type impurity in the second capping semiconductor layer 125B shown in FIG. 8.

As described above, in an embodiment, a first impurity region AR1" may include a first conductivity type impurity having a doping concentration greater than a doping concentration of the second impurity region AR2 shown in FIG. 8, and include a second conductivity type impurity having a doping concentration greater than a doping concentration of the second impurity region AR2 shown in FIG. 8.

Hereinafter, a manufacturing method of a semiconductor memory device in accordance with an embodiment of the present disclosure will be described.

FIGS. 9A, 9B, 10, 11A, 11B, 11C, 12, and 13 are views illustrating a manufacturing method of a semiconductor memory device in accordance with an embodiment of the present disclosure.

Figure 9A:
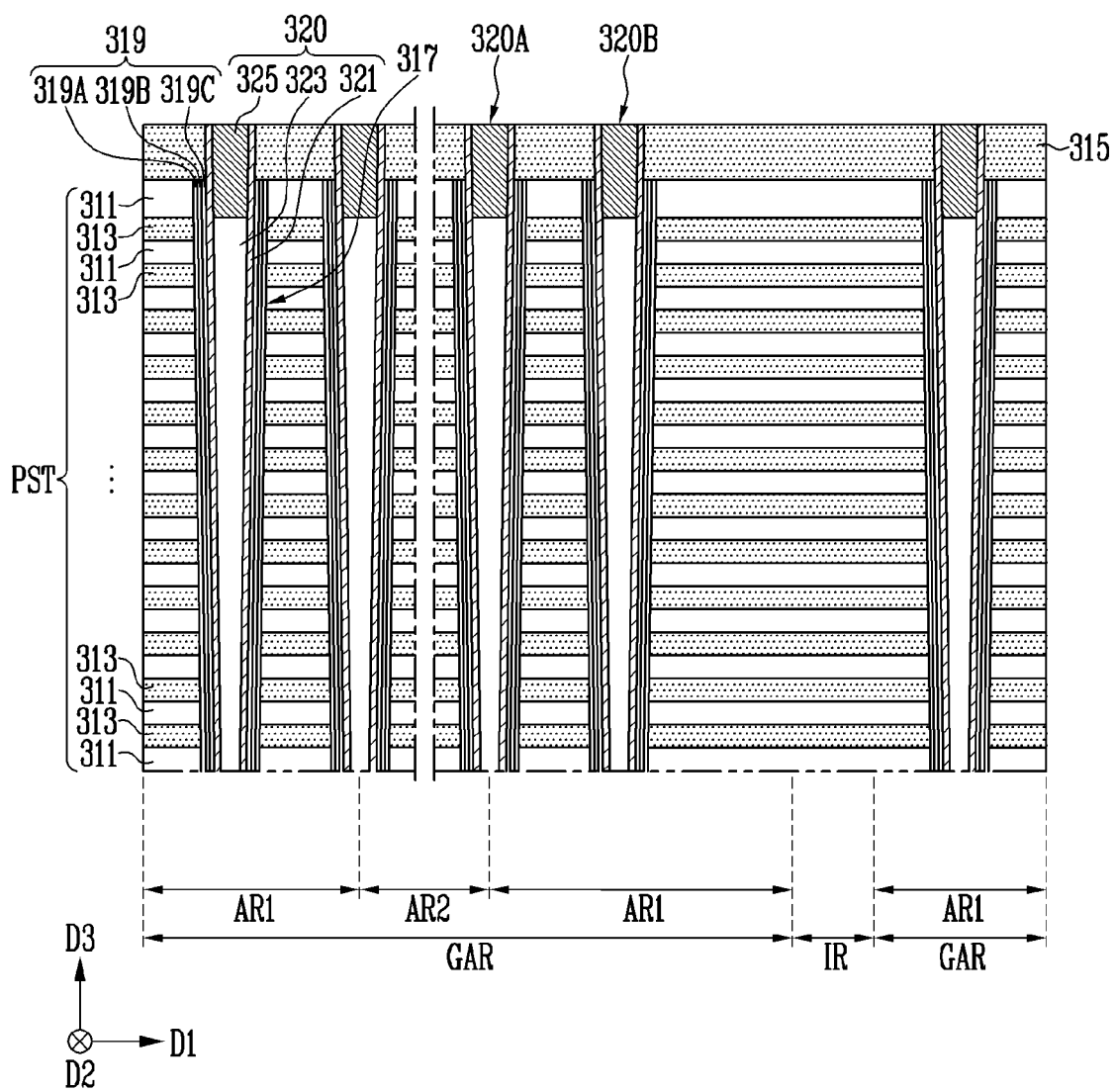
FIGS. 9A, 9B, 10, 11A, 11B, 11C, 12, and 13 are views illustrating a manufacturing method of a semiconductor memory device in accordance with an embodiment of the present disclosure.
Figure 9B:
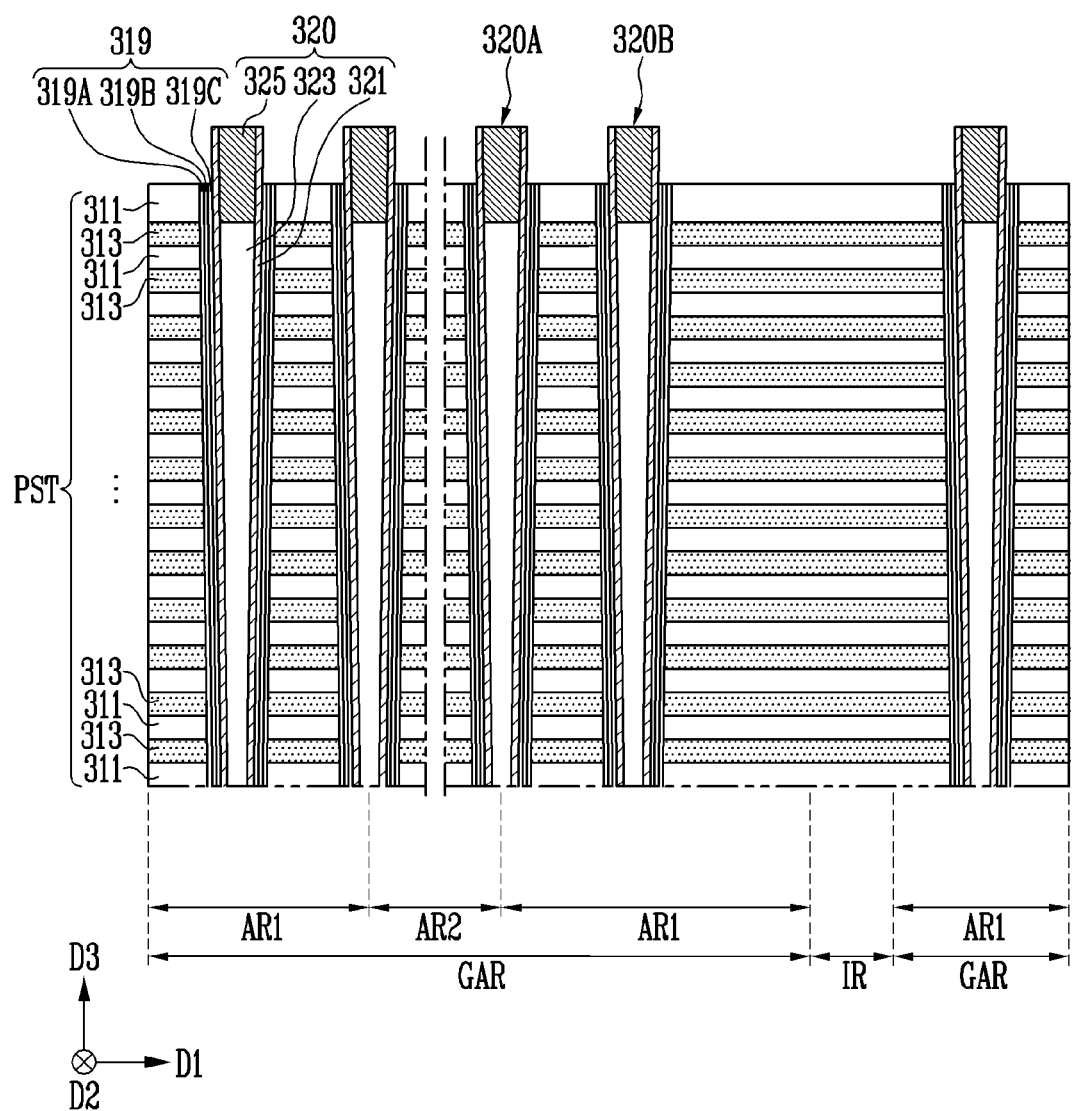

FIGS. 9A and 9B are sectional views illustrating a process of forming a preliminary stack structure PST, a plurality of memory layers 319, and a plurality of channel structures 320.

Referring to FIG. 9A, a preliminary stack structure PST may be formed on a lower structure (not shown) including a substrate, a multi-layer, a peripheral circuit structure, a doped semiconductor structure, and the like. The lower structure may be variously changed. Hereinafter, the manufacturing method of the semiconductor memory device in accordance with the embodiment of the present disclosure will be described based on a process performed on the lower structure.

The preliminary stack structure PST may extend in the first direction D1 and the second direction D2. The preliminary stack structure PST may include a plurality of gate regions GAR spaced apart from each other in the first direction D1 and an isolation region IR between the gate regions GAR. Each gate region GAR may include a first region AR1 and a second region AR2, which are alternately disposed in the first direction D1. The first region AR1 may be disposed at both sides of the second region AR2.

The preliminary stack structure PST may include a plurality of first material layers 311 and a plurality of second material layers 313, which are alternately stacked in the third direction D3. The plurality of second material layers 313 may be configured with a material having an etch selectivity with respect to the first material layers 311. In an embodiment, the plurality of first material layers 311 may be formed of an insulating material for a plurality of interlayer insulating layers, and the plurality of second material layers 313 may be formed of a material having an etch selectivity greater than 1 with respect to the plurality of first material layers 311. For example, the plurality of first material layers 311 may be formed of oxide including silicon oxide and the like, and the plurality of second material layers 313 may be formed of nitride including silicon nitride and the like. However, the embodiment of the present disclosure is not limited thereto. For example, the plurality of first material layers 311 may be formed of oxide including silicon oxide and the like, and the plurality of second material layers 313 may be formed of a conductive material for conductive layers.

Subsequently, a mask layer 315 may be formed on the preliminary stack structure PST. Subsequently, a plurality of holes 317 penetrating the mask layer 315 and the preliminary stack structure PST may be formed through an etching process using a photolithography process. The plurality of holes 317 may penetrate the preliminary stack structure PST in each gate region GAR. Some of the plurality of holes 317 may be spaced apart from the second region AR2 to be formed in the first region AR1, and the others of the plurality of holes 317 may include a part disposed in the first region AR1 and a part disposed in the second region AR2.

Continuously, a memory layer 319 may be formed along a sidewall of each hole 317. The memory layer 319 may include a blocking insulating layer 319A, a data storage layer 319B on the blocking insulating layer 319A, and a tunnel insulating layer 319C on the data storage layer 319B. The blocking insulating layer 319A, the data storage layer 319B, and the tunnel insulating layer 319C may be formed of the same material as the blocking insulating layer BI, the data storage layer DS, and the tunnel insulating layer TI, which are described with reference to FIG. 5.

Subsequently, a channel semiconductor layer 321 may be formed along an inner wall of the memory layer 319. The channel semiconductor layer 321 may be formed of a semiconductor material including silicon, germanium, and the like. A core insulating layer 323 and a capping semiconductor layer 325 may be formed in a central region of the hole 317, which is opened by the channel semiconductor layer 321. The core insulating layer 323 may be formed at a height at which a top end of the hole 317 is opened, and the capping semiconductor layer 325 may fill the top end of the hole 317 on the core insulating layer 323. The capping semiconductor layer 325 may be formed as a doped semiconductor layer including a first conductivity type impurity. The first conductivity type impurity may be an n-type impurity including phosphorus and the like. The capping semiconductor layer 325 may include the first conductivity type impurity at a first concentration. The first conductivity type impurity may be diffused into an end portion of the channel semiconductor layer 321 adjacent to the capping semiconductor layer 325.

Through the above-described process, a plurality of channel structures 320 may be formed, which include the channel semiconductor layer 321, the core insulating layer 323, and the capping semiconductor layer 325. The plurality of channel structures 320 may include a first channel structure 320A and a second channel structure 320B. The first channel structure 320A may include a part penetrating the first region AR1 of the preliminary stack structure PST and a part penetrating the second region AR2 of the preliminary stack structure PST. The second channel structure 320B may penetrate the first region AR1 of the preliminary stack structure PST at a position spaced apart from the second region AR2 of the preliminary stack structure PST.

Referring to FIG. 9B, the mask layer 315 shown in FIG. 9A may be removed. A portion of the memory layer 319 may be removed, and a portion of each channel structure 320 may be exposed.

Figure 10:
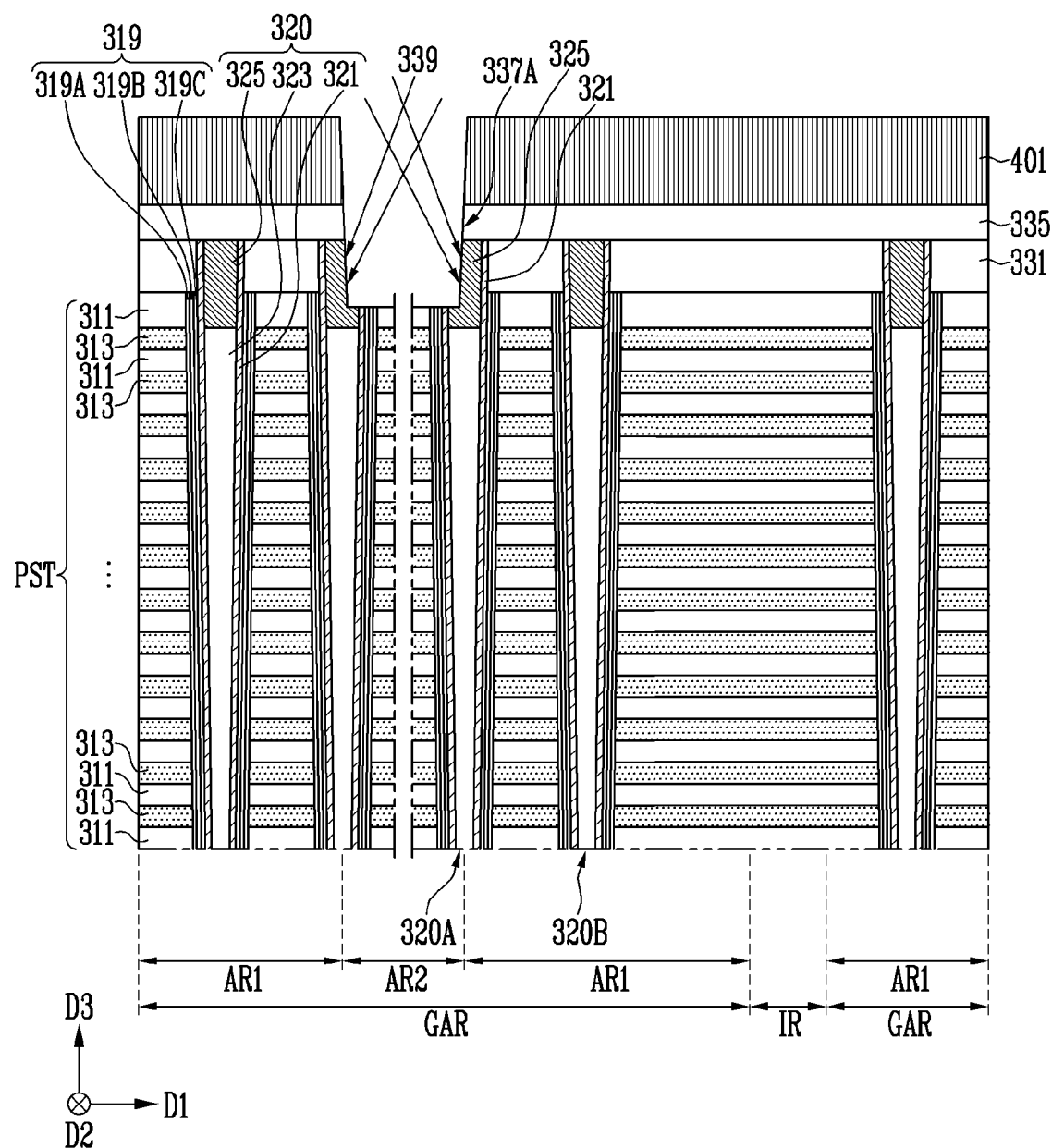

FIG. 10 is a sectional view illustrating a process of additionally implanting the first conductivity type impurity into the capping semiconductor layer 325 of the first channel structure 320A.

Referring to FIG. 10, after a first insulating layer 331 is formed on the preliminary stack structure PST, a surface of the first insulating layer 331 may be planarized. The first insulating layer 331 may surround a portion of each of the plurality of channel structures 320.

Subsequently, a second insulating layer 335 may be formed on the first insulating layer 331. Subsequently, a mask pattern 401 may be formed on the second insulating layer 335. The mask pattern 401 may include an opening exposing the second region AR2 of the preliminary stack structure PST. Subsequently, the second insulating layer 335 and the first insulating layer 331, which overlap with the second region AR2 of the preliminary stack structure PST, may be etched through an etching process using the mask pattern 401 as an etch barrier. Accordingly, a first trench 337A may be formed, which penetrates the first insulating layer 331 and the second insulating layer 335. The first trench 337A may extend along the second direction D2, like the insulating structure 151 shown in FIG. 4. A depth of the first trench 337A may be controlled such that the first trench 337A does not penetrate an uppermost second material layer among the plurality of second material layers 313.

During the etching process for forming the first trench 337A, a portion of the first channel structure 320A among the plurality of channel structure 320 may be etched. Accordingly, the capping semiconductor layer 325 of the first channel structure 320A may be exposed through the first trench 337A. A first conductivity type impurity 339 may be additionally implanted into the exposed capping semiconductor layer 325. The first conductivity type impurity 339 may be diffused into the channel semiconductor layer 321 adjacent to the capping semiconductor layer 325 of the first channel structure 320A.

Through the above-described process, in an embodiment, a first conductivity type impurity doping concentration of the capping semiconductor layer 325 and an end portion of the channel semiconductor layer 321 of the first channel structure 320A may be increased as compared with a first conductivity type impurity doping concentration of the capping semiconductor layer 325 and an end portion of the channel semiconductor layer 321 of the second channel structure 320B.

Figure 11A:
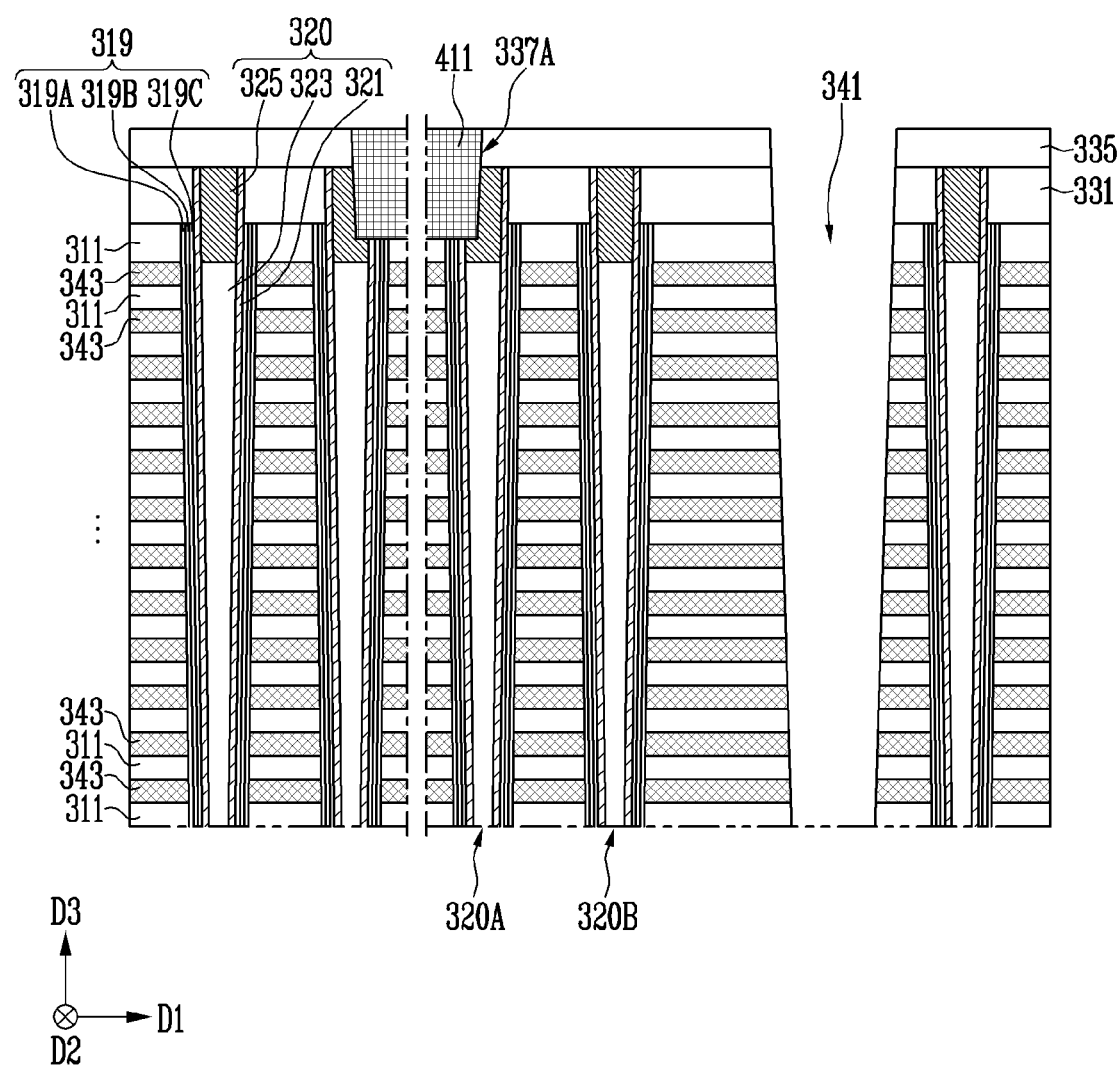
Figure 11B:
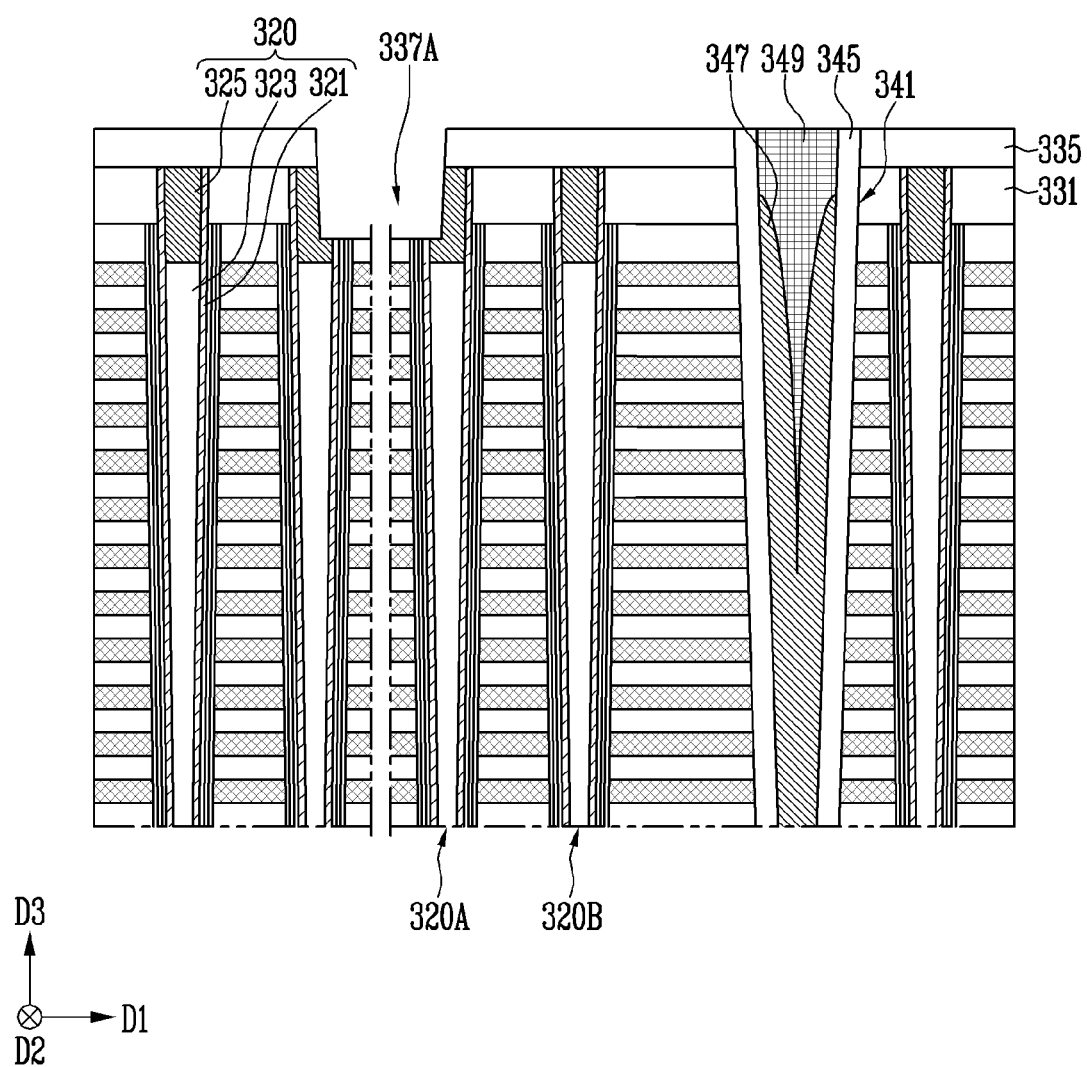
Figure 11C:
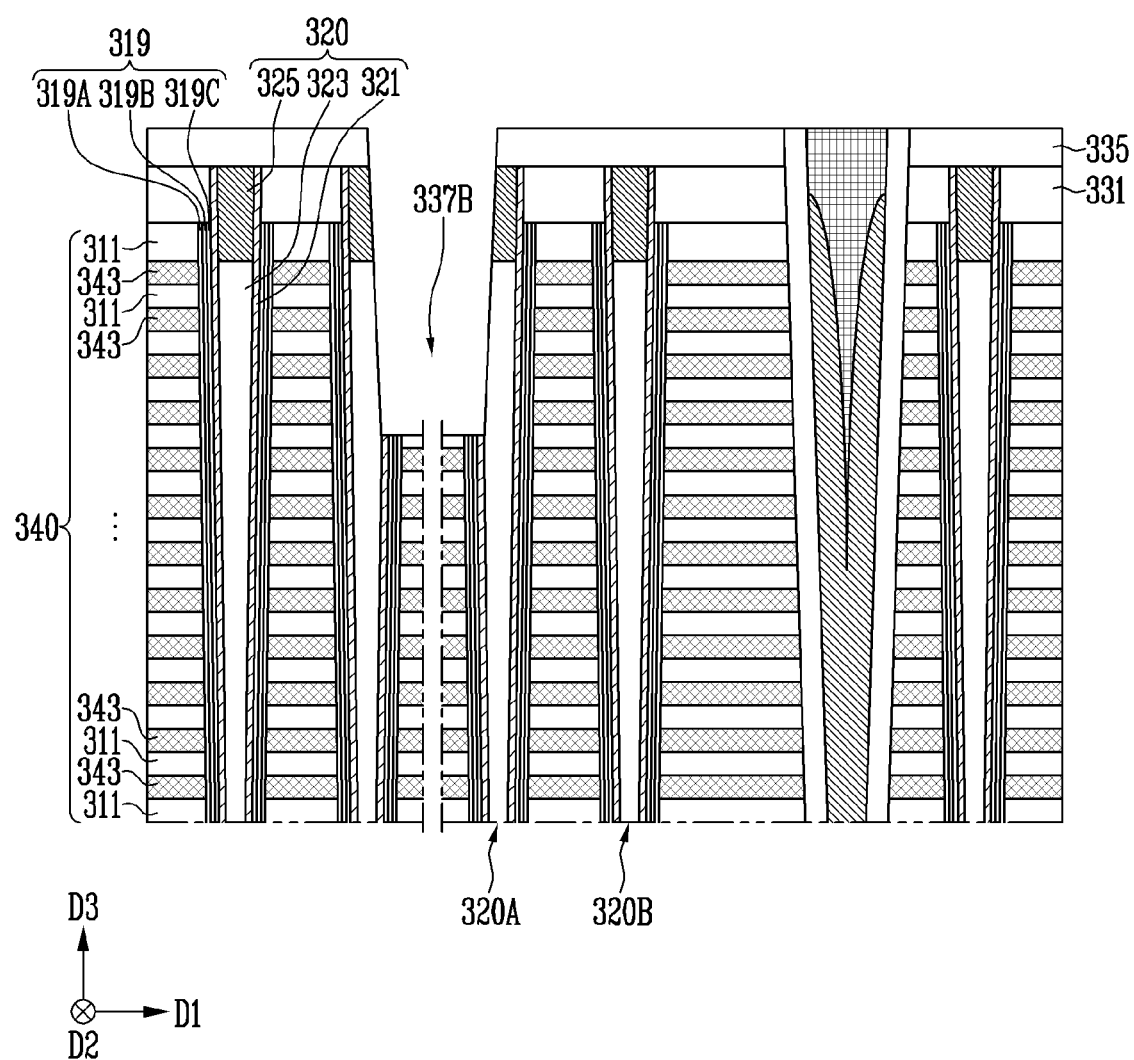

FIGS. 11A to 11C are sectional views illustrating a process of forming a gate stack structure 340.

Referring to FIG. 11A, the mask pattern 401 shown in FIG. 10 may be removed, and the first trench 337A may be filled with a sacrificial layer 411. The sacrificial layer 411 may include a material having an etch selectivity with respect to the first insulating layer 331, the second insulating layer 335, the plurality of first material layers 311, and the plurality of second material layers 313 shown in FIG. 10. In an embodiment, the sacrificial layer 411 may include at least one of a metal and a conductive nitride layer. For example, the sacrificial layer 411 may include tungsten.

Subsequently, a slit 341 may be formed, which penetrates the isolation region IR of the preliminary stack structure PST shown in FIG. 10 and the first insulating layer 331 and the second insulating layer 335, which overlap with the isolation region IR of the preliminary stack structure PST. When the plurality of second material layers 313 shown in FIG. 10 are formed of nitride including silicon nitride and the like, a replace process of replacing the plurality of second material layers 313 shown in FIG. 10 with a plurality of conductive layers 343 through the slit 341 may be performed. The plurality of first material layers 311 may remain as interlayer insulating layers.

When the plurality of second material layers 313 shown in FIG. 10 are formed of a conductive material, the above-described replace process may be omitted.

Referring to FIG. 11B, a vertical structure may be formed inside the slit 341. In an embodiment, the process of forming the vertical structure may include a process of forming a sidewall insulating layer 345 on a sidewall of the slit 341, a process of forming a doped semiconductor layer 347 on the sidewall insulating layer 345, and a process of forming a metal layer 349 inside the slit 341 opened by the doped semiconductor layer 347. The doped semiconductor layer 347 may correspond to the channel contact layer 103 described with reference to FIG. 5.

Subsequently, the sacrificial layer 411 shown in FIG. 11A may be selectively removed, thereby opening the first trench 337A.

Referring to FIG. 11C, an etching process may be performed such that at least one conductive layer among the plurality of conductive layers 343 is penetrated through the first trench 337A shown in FIG. 11B. Accordingly, a second trench 337B may be formed. The second trench 337B may isolate the at least one conductive layer into drain select lines. During the etching process for forming the second trench 337B, a portion of the first channel structure 320A and a portion of the memory layer 319 surrounding the first channel structure 320A may be etched.

Through the above-described process, a gate stack structure 340 may be formed, which includes the conductive layers 343 partitioned into the source select line SSL, the plurality of word lines WL, the first drain select line DSL1, and the second drain select line DSL2, which are described with reference to FIG. 4.

Figure 12:
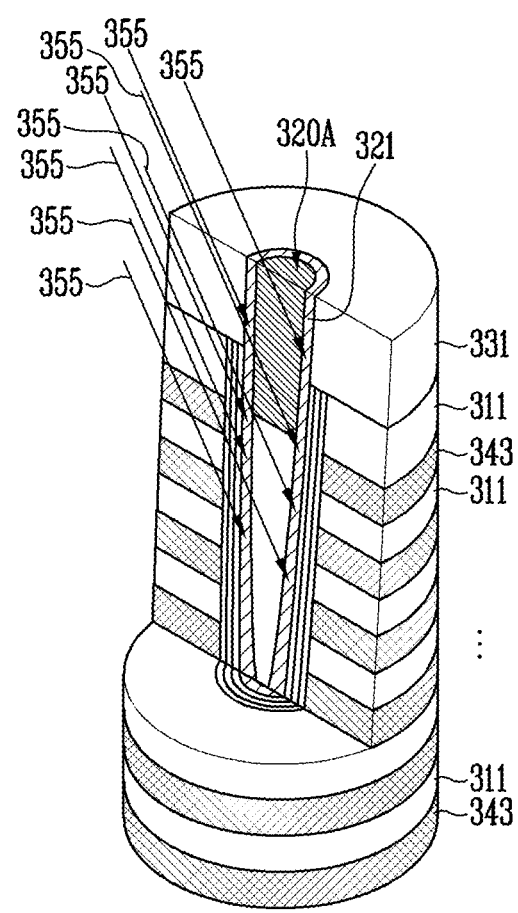

FIG. 12 is a perspective view illustrating a process of implanting a second conductivity type impurity. FIG. 12 illustrates an end portion of the first channel structure 320A shown in FIG. 11C, conductive layers 343 at the periphery of the end portion of the first channel structure 320A, and first material layers 311 at the periphery of the end portion of the first channel structure 320A.

Referring to FIG. 12, the channel semiconductor layer 321 of the first channel structure 320A may be exposed through the second trench 337B shown in FIG. 11C. The second trench 337B shown in FIG. 11C may have an inclined sidewall because of characteristics of the etching process. The channel semiconductor layer 321 of the first channel structure 320A may be exposed along the inclined sidewall of the second trench 337B shown in FIG. 11C. A second conductivity type impurity 355 may be implanted into an inclined surface of the channel semiconductor layer 321 of the first channel structure 320A. The second conductivity type impurity 355 may be a p-type impurity.

Through the above-described process of implanting the second conductivity type impurity 355, the second conductivity type impurity region 121A2 described with reference to FIGS. 7B and 7C may be formed.

Figure 13:
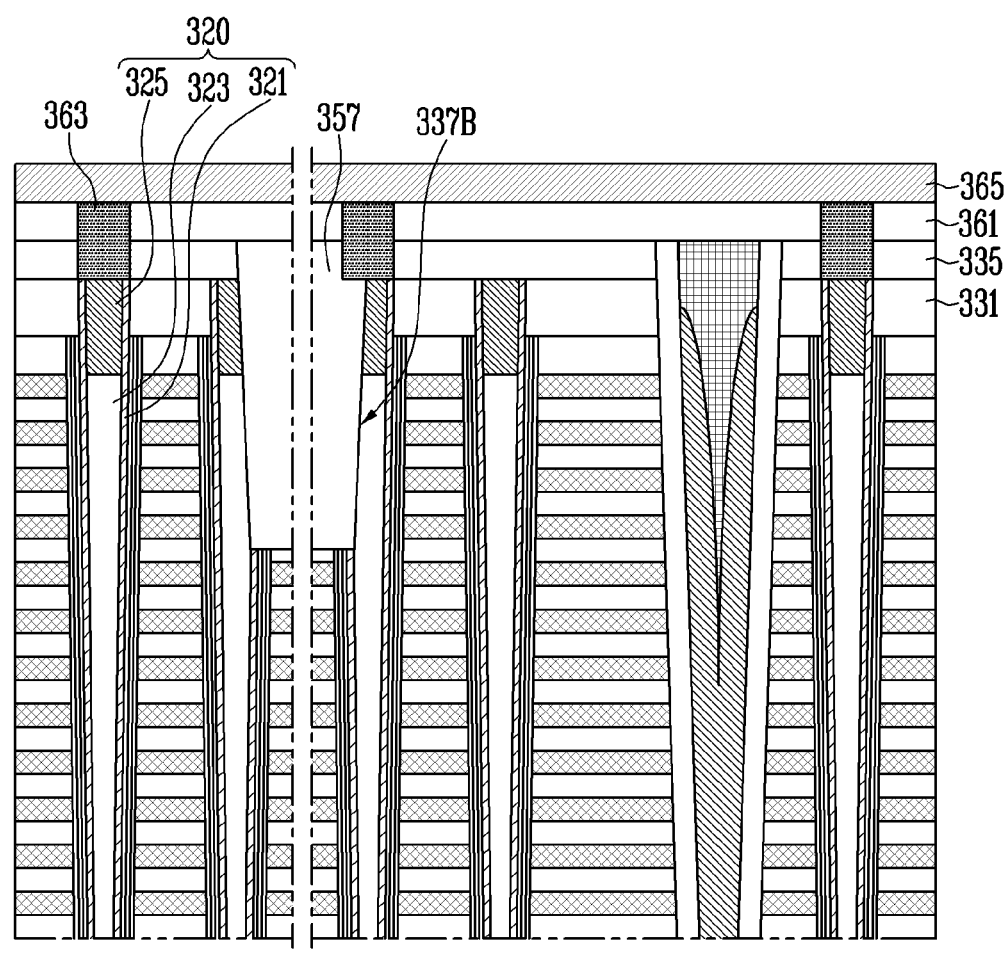
Figure 13:
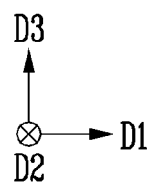

FIG. 13 is a sectional view illustrating subsequent processes continued after the process shown in FIG. 12.

Referring to FIG. 13, the second trench 337B may be filled with an insulating structure 357. Subsequently, a third insulating layer 361 may be formed on the second insulating layer 335. A plurality of contact plugs 363 may be formed of a conductive material penetrating the second insulating layer 335 and the third insulating layer 361, and some contact plugs 363 may extend to the inside of the insulating structure 357.

Subsequently, a plurality of bit lines 365 may be formed, which are connected to the plurality of contact plugs 363.

Figure 14:
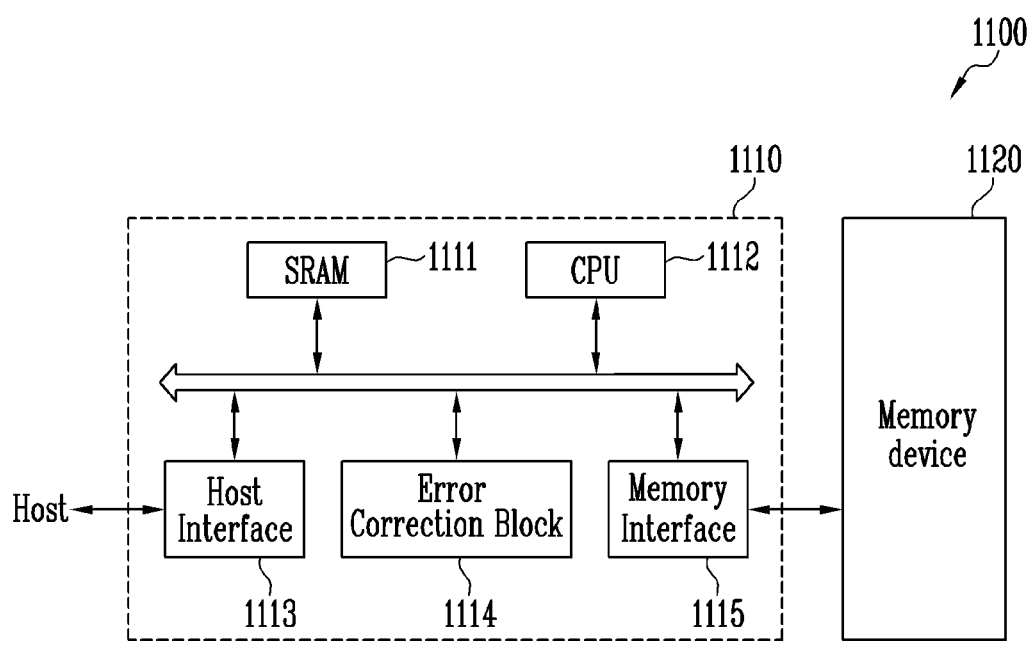
FIG. 14 is a block diagram illustrating a configuration of a memory system in accordance with an embodiment of the present disclosure.

FIG. 14 is a block diagram illustrating a configuration of a memory system in accordance with an embodiment of the present disclosure.

Referring to FIG. 14, the memory system 1100 includes a memory device 1120 and a memory controller 1110.

The memory device 1120 may be a multi-chip package configured with a plurality of flash memory chips. In an embodiment, the memory device 1120 may include a first channel structure which is adjacent to an insulating structure and penetrates a plurality of conductive layers, a second channel structure which is spaced apart from the insulating structure and penetrates the plurality of conductive layers, a first impurity region included in an end portion of the first channel structure, and a second impurity region included in an end portion of the second channel structure. In an embodiment, a doping concentration of an impurity in the first impurity region is different from a doping concentration of an impurity in the second impurity region.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in a data read from the memory device 1120, and corrects the detected error. The memory interface 1115 interfaces with the memory device 1120. The memory controller 1110 may further include a Read Only Memory (ROM) for storing code data for interfacing with the host, and the like.

The memory system 1100 configured as described above may be a memory card or a Solid State Disk (SSD), in which the memory device 1120 is combined with the memory controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 15:
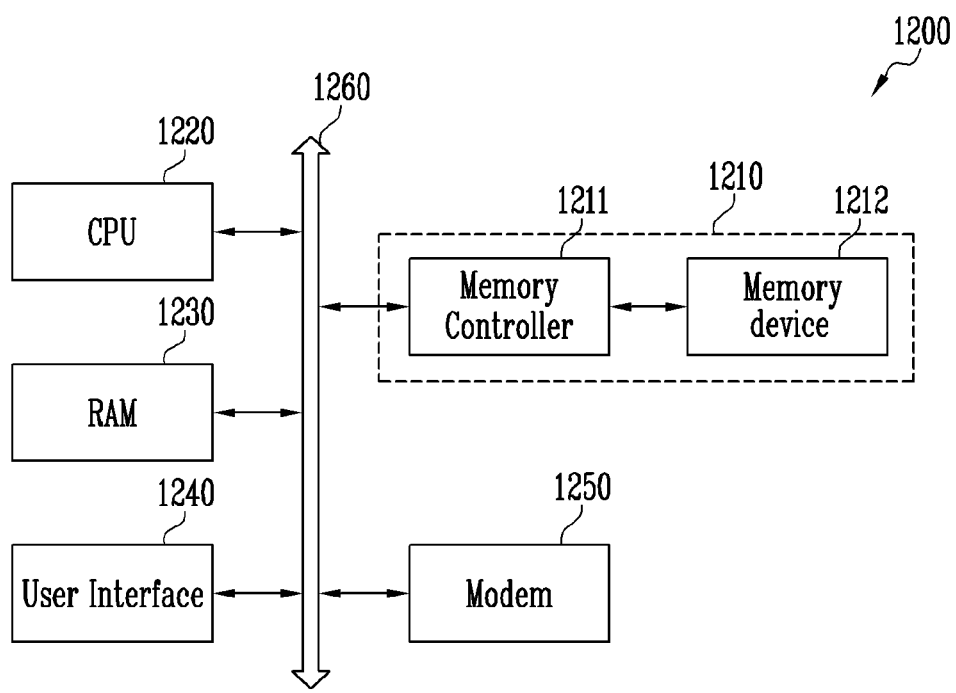
FIG. 15 is a block diagram illustrating a configuration of a computing system in accordance with an embodiment of the present disclosure.

FIG. 15 is a block diagram illustrating a configuration of a computing system in accordance with an embodiment of the present disclosure.

Referring to FIG. 15, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211. The memory device 1212 may be the same as the memory device 1120 described above with reference to FIG. 14. The memory controller 1211 may be to the same as the memory controller 1110 described above with reference to FIG. 14.

In accordance with various embodiments of the present disclosure, an impurity region of a first channel structure adjacent to an insulating structure is differentiated from an impurity region of a second channel structure spaced apart from the insulating structure, so that the operational reliability of a memory cell string connected to the first channel structure may be improved.

What is claimed is:
1. A semiconductor memory device comprising:
 a word line;
 a select line spaced apart from the word line, the select line overlapping with the word line;
 an insulating structure overlapping with the word line, the insulating structure extending along an edge of the select line;
 a first channel structure adjacent to the insulating structure, the first channel structure penetrating the word line and the select line;
 a second channel structure spaced apart from the insulating structure, the second channel structure penetrating the word line and the select line;
 a first impurity region included in an end portion of the first channel structure, wherein the end portion of the first channel structure is adjacent to the select line; and
 a second impurity region included in an end portion of the second channel structure, wherein the end portion of the second channel structure is adjacent to the select line,
 wherein a doping concentration of an impurity in the first impurity region is different from a doping concentration of an impurity in the second impurity region.

2. The semiconductor memory device of claim 1, wherein each of the first impurity region and the second impurity region includes an n-type impurity,
 wherein a doping concentration of the n-type impurity in the first impurity region is greater than a doping concentration of the n-type impurity in the second impurity region.

3. The semiconductor memory device of claim 1, wherein each of the first impurity region and the second impurity region includes an n-type impurity region,
 wherein the first impurity region further includes a p-type impurity region between the n-type impurity region and the insulating structure.

4. The semiconductor memory device of claim 3, wherein the doping concentration of the n-type impurity in the first impurity region is substantially the same as the doping concentration of the n-type impurity in the second impurity region.

5. The semiconductor memory device of claim 3, wherein the doping concentration of the n-type impurity in the first impurity region is greater than the doping concentration of the n-type impurity in the second impurity region.

6. The semiconductor memory device of claim 1, further comprising:
 a first memory layer extending along a sidewall of the first channel structure, the first memory layer having an opening opened toward the insulating structure; and
 an annular second memory layer surrounding a sidewall of the second channel structure.

7. The semiconductor memory device of claim 1, wherein the first channel structure includes:
 a core insulating layer extending in a stacking direction of the word line and the select line;
 a capping semiconductor layer on the core insulating layer; and
 a channel semiconductor layer extending along a sidewall of the core insulating layer and a sidewall of the capping semiconductor layer,
 wherein the channel semiconductor layer includes a part in contact with the insulating structure, and
 wherein the capping semiconductor layer includes a part in contact with the insulating structure.

8. The semiconductor memory device of claim 7, wherein the first impurity region is included inside the capping semiconductor layer and at an end portion of the channel semiconductor layer, and
 wherein the end portion of the channel semiconductor layer is adjacent to the capping semiconductor layer and the select line.

9. A semiconductor memory device comprising:
 a gate stack structure including a plurality of conductive layers and a plurality of interlayer insulating layers, wherein the conductive layers and the interlayer insulating layers each have a surface extending in first and second directions, the first and second directions intersecting each other, wherein the conductive layers and the interlayer insulation layers are alternately stacked in a third direction, and wherein the third direction intersects the surface;
 an insulating structure penetrating at least one of the plurality of conductive layers;
 a first channel structure in contact with the insulating structure, the first channel structure extending in the third direction to penetrate the gate stack structure;

a second channel structure spaced apart from the insulating structure, the second channel structure extending in the third direction to penetrate the gate stack structure;

a first impurity region included in an end portion of the first channel structure; and a second impurity region included in an end portion of the second channel structure, wherein each of the first impurity region and the second impurity region includes an n-type impurity, and wherein a doping concentration of the n-type impurity in the first impurity region is greater than a doping concentration of the n-type impurity in the second impurity region.

10. The semiconductor memory device of claim 9, wherein the first channel structure includes:

a first core insulating layer extending in the third direction;

a first capping semiconductor layer disposed on the first core insulating layer, the first capping semiconductor layer including the n-type impurity; and a first channel semiconductor layer extending along a sidewall of the first core insulating layer and a sidewall of the first capping semiconductor layer, and wherein the first channel semiconductor layer and the first capping semiconductor layer include a part in contact with the insulating structure.

11. The semiconductor memory device of claim 10, wherein the second channel structure includes:

a second core insulating layer extending in the third direction;

a second capping semiconductor layer disposed on the second core insulating layer, the second capping semiconductor layer including the n-type impurity; and a second channel semiconductor layer surrounding a sidewall of the second core insulating layer and a sidewall of the second capping semiconductor layer, wherein a cross-sectional structure of the first channel semiconductor layer is different from a cross-sectional structure of the second channel semiconductor layer, and wherein a cross-sectional structure of the first capping semiconductor layer is different from a cross-sectional structure of the second capping semiconductor layer.

12. The semiconductor memory device of claim 10, further comprising a p-type impurity region included in a portion of the first channel semiconductor layer adjacent to the insulating structure.

13. The semiconductor memory device of claim 9, wherein the first channel structure includes a linear first side portion in contact with the insulating structure and a round second side portion, the round second side portion extending from the linear first side portion in a direction distant from the insulating structure, and wherein the second channel structure has substantially a circular cross-sectional structure.

14. A semiconductor memory device comprising:

a gate stack structure including a plurality of conductive layers and a plurality of interlayer insulating layers, wherein the conductive layers and the interlayer insulating layers each have a surface extending in first and second directions, the first and second directions intersecting each other, wherein the conductive layers and the interlayer insulation layers are alternately stacked in a third direction, and wherein the third direction intersects the surface;

an insulating structure penetrating at least one of the plurality of conductive layers;

a first channel structure in contact with the insulating structure, the first channel structure extending in the third direction to penetrate the gate stack structure; and a second channel structure spaced apart from the insulating structure, the second channel structure extending in the third direction to penetrate the gate stack structure, wherein the first channel structure includes a first core insulating layer extending in the third direction, and a first channel semiconductor layer extending along a sidewall of the first core insulating layer and protruding father than the first core insulating layer in the third direction, and wherein the first channel semiconductor layer includes an n-type impurity region spaced apart from the insulating structure, and a p-type impurity region disposed between the n-type impurity region and the insulating structure.

15. The semiconductor memory device of claim 14, wherein the first channel structure further includes a first capping semiconductor layer on the first core insulating layer, wherein the first channel semiconductor layer extends along a sidewall of the first capping semiconductor layer, and wherein the first channel semiconductor layer and the first capping semiconductor layer include a part in contact with the insulating structure.

16. The semiconductor memory device of claim 15, wherein the n-type impurity region extends into the first capping semiconductor layer.

17. The semiconductor memory device of claim 15, wherein the second channel structure includes:

a second core insulating layer extending in the third direction;

a second capping semiconductor layer on the second core insulating layer; and a second channel semiconductor layer surrounding a sidewall of the second core insulating layer and a sidewall of the second capping semiconductor layer, wherein a cross-sectional structure of the first channel semiconductor layer is different from a cross-sectional structure of the second channel semiconductor layer, and wherein a cross-sectional structure of the first capping semiconductor layer is different form a cross-sectional structure of the second capping semiconductor layer.

18. The semiconductor memory device of claim 17, wherein each of the first capping semiconductor layer and the second capping semiconductor layer includes an n-type impurity.

19. The semiconductor memory device of claim 14, wherein the first channel structure includes a linear first side portion in contact with the insulating structure and a round second side portion, the round second side portion extending from the linear first side portion in a direction distant from the insulating structure, and wherein the second channel structure has substantially a circular cross-sectional structure.

* * * * *